(12) United States Patent
Pletcher et al.

(10) Patent No.: US 11,281,463 B2
(45) Date of Patent: Mar. 22, 2022

(54) CONVERSION OF UNORM INTEGER VALUES TO FLOATING-POINT VALUES IN LOW POWER

(71) Applicant: Intel Corporation, Santa Clara, CA (US)

(72) Inventors: Benjamin Pletcher, Mather, CA (US); Rahul Kumar, Sacramento, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/935,037

(22) Filed: Mar. 25, 2018

(65) Prior Publication Data
US 2019/0042246 A1 Feb. 7, 2019

(51) Int. Cl.
| G06F 9/30 | (2018.01) |
| H03M 7/24 | (2006.01) |
| G06F 5/01 | (2006.01) |
| G06F 7/483 | (2006.01) |
| G06N 3/08 | (2006.01) |
| G06N 3/063 | (2006.01) |

(52) U.S. Cl.
CPC .......... *G06F 9/30025* (2013.01); *H03M 7/24* (2013.01); *G06F 5/012* (2013.01); *G06F 7/483* (2013.01); *G06N 3/063* (2013.01); *G06N 3/08* (2013.01)

(58) Field of Classification Search
CPC ...... G06F 9/30025; G06F 5/012; G06F 7/483; H03M 7/24
See application file for complete search history.

(56) References Cited

U.S. PATENT DOCUMENTS

| 5,257,215 | A | * | 10/1993 | Poon | H03M 7/24 708/204 |
| 5,282,156 | A | * | 1/1994 | Miyoshi | G06F 7/74 708/205 |
| 6,523,050 | B1 | * | 2/2003 | Dhablania | H03M 5/00 708/204 |
| 7,023,437 | B1 | | 4/2006 | Voorhies et al. | |
| 7,774,393 | B1 | * | 8/2010 | Brooks | H03M 7/24 708/204 |
| 8,190,669 | B1 | * | 5/2012 | Oberman | G06F 7/44 708/523 |
| 10,713,013 | B1 | * | 7/2020 | Old | G06F 7/556 |

(Continued)

OTHER PUBLICATIONS

Intel® 64 and IA-32 Architectures Software Developer's Manual, Documentation Changes, Sep. 2016, 1,299 pages.

(Continued)

*Primary Examiner* — Michael D. Yaary
(74) *Attorney, Agent, or Firm* — Spectrum IP Law Group LLC

(57) ABSTRACT

Methods and apparatus relating to conversion of an unsigned normalized (unorm) integer values to floating-point (float) values in low power are described. In an embodiment, conversion logic converts a unorm integer value to a floating-point value based on detection of whether the unorm integer matches one of three cases, wherein the unorm integer value comprises n bits. Memory stores a count value corresponding to n−1 bits of the unorm integer value after detection of a leading 1 in the unorm integer value. The three cases include: a first case with all zeros, a second case with all ones, and a third case with a combination of one or more zeros and one or more ones. Other embodiments are also disclosed and claimed.

27 Claims, 21 Drawing Sheets

(56) References Cited

U.S. PATENT DOCUMENTS

| | | | |
|---|---|---|---|
| 2002/0196252 | A1 | 12/2002 | Liao et al. |
| 2003/0038803 | A1 | 2/2003 | Morein et al. |
| 2006/0101244 | A1* | 5/2006 | Siu .................. G06F 7/483 712/221 |
| 2014/0118347 | A1 | 5/2014 | Hakura et al. |
| 2014/0333619 | A1 | 11/2014 | Morphet et al. |
| 2015/0039661 | A1* | 2/2015 | Blomgren ............ H03M 7/24 708/204 |
| 2016/0062947 | A1 | 3/2016 | Chetlur et al. |
| 2016/0086340 | A1 | 3/2016 | Woo et al. |
| 2016/0092169 | A1* | 3/2016 | Lutz .................. G06F 7/485 708/205 |
| 2016/0098856 | A1 | 4/2016 | Broadhurst et al. |
| 2016/0124708 | A1* | 5/2016 | Engh-Halstvedt ...... G06F 7/535 708/204 |
| 2016/0217608 | A1 | 7/2016 | Howson |

OTHER PUBLICATIONS

Data Conversion Rules (Windows), Feb. 7, 2018, 6pages.

Goodfellow, et al. "Adaptive Computation and Machine Learning Series", Book, Nov. 18, 2016, pp. 98-165, Chapter 5, The MIT Press, Cambridge, MA.

Lindholm, et al., "NVIDIA Tesla: A Unified Graphics and Computing Architecture," journal, Mar.-Apr. 2008, pp. 39-55, 0272-1732/08, IEEE Computer Society, Washington D.C.

Nicholas Wilt, "The CUDA Handbook: A Comprehensive Guide to GPU Programming," Jun. 10, 2013, 7 pages, ISBN 0134852745, Pearson Education, New York, NY.

Nicholas Wilt, "The CUDA Handbook; A Comprehensive Guide to GPU Programming", Book, Jun. 22, 2013, pp. 41-57, Addison-Wesley Professional, Boston, MA.

Nvidia, "Nvidia Turing GPU Architecture; Graphics Reinvented," Whitepaper, 2018, 86 pages, WP-09183-001_v01, Nvidia, Santa Clara, CA.

Ross, et al. "Intel Processor Graphics: Architecture & Programming", Power Point Presentation, Aug. 2015, 78 pages, Intel Corporation, Santa Clara, CA.

Shane Cook, "CUDA Programming; A Developer's Guide to Parallel Computing with GPUs," book, 2013, 591 pages, ISBN: 978-0-12-415933-4, Morgan Kaufmann, Waltham, MA.

Shane Cook, "CUDA Programming", Book, 2013, pp. 37-52, Chapter 3, Elsevier Inc., Amsterdam Netherlands.

Stephen Junking, "The Compute Architecture of Intel Processor Graphics Gen9", paper, Aug. 14, 2015, 22 pages, Version 1.0, Intel Corporation, Santa Clara, CA.

* cited by examiner

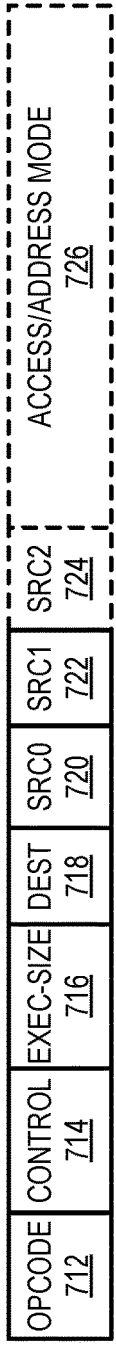
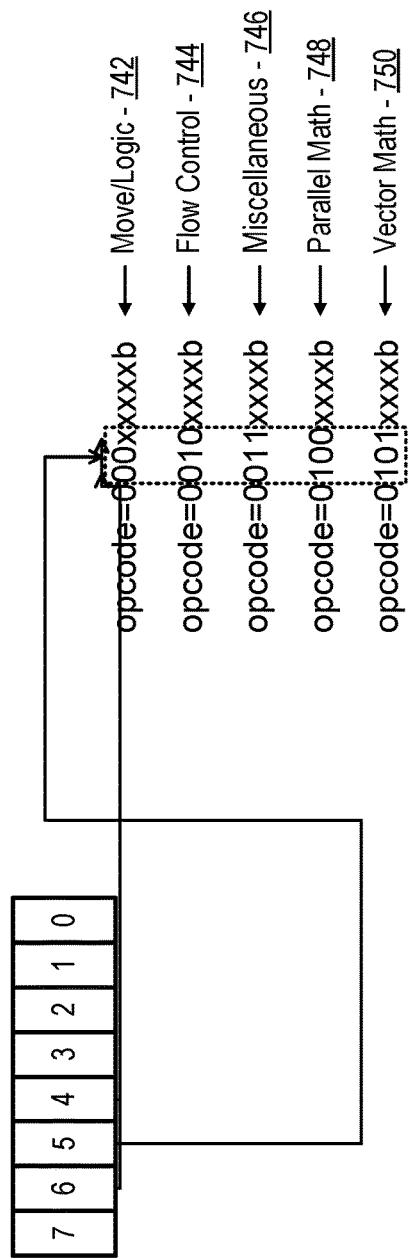
FIG. 7

GRAPHICS PROCESSOR COMMAND FORMAT 900

| CLIENT 902 | OPCODE 904 | SUB-OPCODE 905 | DATA 906 | COMMAND SIZE 908 |

Input [7:0] = input number to expand.
S = sign of output float
E = exponent of output float
M = mantissa of output float //Set sign
S = 0
Input [7:0] = input //Detect zero
Zero = (input [7:0] = "0x00")

//Detect one
One = (input [7:0] = "0xFF")

//Get mantissa and exponent for cases not zero or one.
Shift [2:0] = leadingzero (input [7:0]) //Shift value of 8 is a do not care so 3 bits is enough.
Input = input << shift [2:0] //MSB will be 1.

Mantissa [23:0] = cat (input [7:0], input [7:0], input [7:0], input [7]) //Bit -1 will always be 1, //final mantissa normal case If float32
If (zero OR one) then M = 0 else M = cat (mantissa [22:8], (mantissa [7:0] + 1)) //Drop leading 1 and note that there will always be at least one zero in the 8 LSBs and the -1 bit must be one.
If zero then E = 0x00 else
        If one then E = 0x3f8
                Else E = 0X3e – shift [2:0] //Normal case If float16
If (zero OR one) then M = 0 else M = cat (mantissa [22:20], (mantissa [19:12] + 1)) >>1. // same as float32 except we do NOT know if the bit 12 is one so we must use 12 bits and /2. The rule of at least one zero in an eight bit window is still true.
If zero then E = 0x00 else
        If one then E = 0x0f
                Else E = 0Xe – shift [2:0] //Normal case

FIG. 16

CONVERSION OF UNORM INTEGER VALUES TO FLOATING-POINT VALUES IN LOW POWER

FIELD

The present disclosure generally relates to the field of electronics. More particularly, some embodiments relate to techniques to conversion of unsigned normalized (unorm) integer values to floating-point (float) values in low power.

BACKGROUND

As integrated circuit fabrication technology improves, manufacturers are able to integrate additional functionality onto a single silicon substrate. As the number of the functions increases, so does the number of components on a single Integrated Circuit (IC) chip. Additional components add additional signal switching, in turn, generating more heat and/or consuming more power. The additional heat may damage components on the chip by, for example, thermal expansion. Also, the additional power consumption may limit usage locations and/or usage models for such devices, e.g., especially for devices that rely on battery power to function. Hence, efficient power management can have a direct impact on efficiency, longevity, as well as usage models for electronic devices.

BRIEF DESCRIPTION OF THE DRAWINGS

So that the manner in which the herein recited features of the present embodiments can be understood in detail, a more particular description of the embodiments may be had by reference to embodiments, some of which are illustrated in the appended drawings. It is to be noted, however, that the appended drawings illustrate only typical embodiments and are therefore not to be considered limiting of their scope.

FIG. 7 illustrates graphics core instruction formats, according to some embodiments.

FIG. 16 shows a sample pseudo code to implement an 8-bit unorm conversion, according to an embodiment.

DETAILED DESCRIPTION

Figure 1:
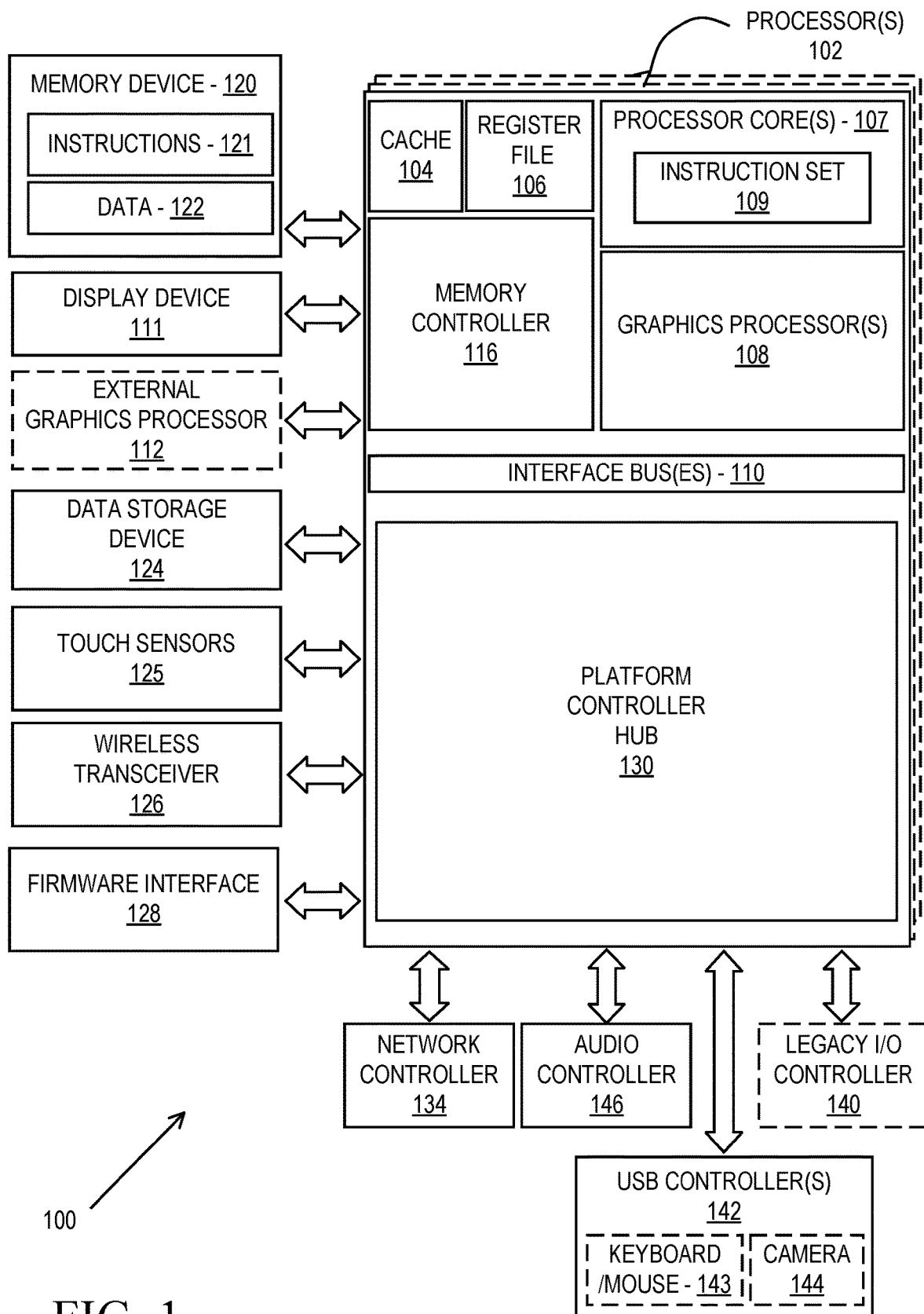
FIG. 1 is a block diagram of a processing system 100, according to an embodiment.

In the following description, numerous specific details are set forth in order to provide a thorough understanding of various embodiments. However, various embodiments may be practiced without the specific details. In other instances, well-known methods, procedures, components, and circuits have not been described in detail so as not to obscure the particular embodiments. Further, various aspects of embodiments may be performed using various means, such as integrated semiconductor circuits ("hardware"), computer-readable instructions organized into one or more programs ("software"), or some combination of hardware and software. For the purposes of this disclosure reference to "logic" shall mean either hardware, software, firmware, or some combination thereof.

As mentioned above, efficient power management can have a direct impact on efficiency, longevity, as well as usage models for electronic devices. For example, format conversion is expensive in terms of gate count and power consumption in algorithmic hardware units like a Graphics Processing Unit (GPU). Unorm (Unsigned normalized) integer value conversion to float (floating-point) value is the most common conversion in texture filtering units. Due to scaling frequencies, the associated power scaling problem has to be solved.

As discussed herein, snorm (signed normalized) and unorm operations are wrappers over "float" and provide clamping behavior. Moreover, snorm and unorm clamp a floating-point value into the range [−1.0, 1.0] and [0.0, 1.0], respectively. For example, a unorm value corresponds to an n-bit number, all 0's means 0.0f, and all 1's means 1.0f. Hence, a sequence of evenly spaced floating point values from 0.0f to 1.0f can be represented, e.g., where a two-bit unorm value represents 0.0f, ⅓, ⅔, and 1.0f.

To this end, some embodiments provide techniques for conversion of unorm values to float values in low power. In an embodiment, unorm to float conversion can be simplified by addressing three cases: all zero, all ones, and the rest. For all zeros and all ones, the answer is a constant. For the rest, the leading detection, shift, and round can be limited to at most n bits, where n (e.g., 8, 16, 32, etc.) is the size of the unorm value. This allows for point sample bypass in the Floating Point unit (FL unit) of a sampler (which may have at least 40% utilization in all benchmarks) and would reduce power significantly (e.g., by 60 pF for point power state). Logic to provide the conversion of unorm values to float values may be coupled to or provided in a processor (where the processor may be a general purpose processor, a graphics processor (or Graphics Processing Unit (GPU), a General Purpose GPU (GPGPU), etc.).

Such techniques may improve the power efficiency of products ranging from low-power (e.g., mobile) devices all the way to servers. Also, one or more embodiments may be applied in discrete as well as integrated GPU subsystems to maximize energy efficiency. As discussed herein, an integrated GPU generally refers to a graphics logic including a GPU that is integrated on a processor, or otherwise on the same integrated circuit device or System on Chip (SOC) as a processor having one or more processor cores. Although embodiments are not limited to integrated GPUs and may also be applied to discrete GPUs and/or discrete graphics logic, e.g., which may be integrated with one or more components (such as a network device, a display device, a keyboard (or other input device such as a mouse, trackball, touchpad, etc.), a port expansion hub, a battery, etc.).

Further, some embodiments may be applied in computing systems that include one or more processors (e.g., with one or more processor cores), such as those discussed with reference to FIG. 1 et seq., including for example mobile computing devices, e.g., a smartphone, tablet, UMPC (Ultra-Mobile Personal Computer), laptop computer, Ultrabook™ computing device, wearable devices (such as a smart watch or smart glasses), etc.

In some embodiments, a graphics processing unit (GPU) is communicatively coupled to host/processor cores to accelerate graphics operations, machine-learning operations, pattern analysis operations, and various General-Purpose GPU (GPGPU) functions. The GPU may be communicatively coupled to the host processor/cores over a bus or another interconnect (e.g., a high-speed interconnect such as PCIe or NVLink). In other embodiments, the GPU may be integrated on the same package or chip as the cores and communicatively coupled to the cores over an internal processor bus/interconnect (i.e., internal to the package or chip). Regardless of the manner in which the GPU is connected, the processor cores may allocate work to the GPU in the form of sequences of commands/instructions contained in a work descriptor. The GPU then uses dedicated circuitry/logic for efficiently processing these commands/instructions.

In the following description, numerous specific details are set forth to provide a more thorough understanding. However, it will be apparent to one of skill in the art that the embodiments described herein may be practiced without one or more of these specific details. In other instances, well-known features have not been described to avoid obscuring the details of the present embodiments.

System Overview

FIG. 1 is a block diagram of a processing system 100, according to an embodiment. In various embodiments the system 100 includes one or more processors 102 and one or more graphics processors 108, and may be a single processor desktop system, a multiprocessor workstation system, or a server system having a large number of processors 102 or processor cores 107. In one embodiment, the system 100 is a processing platform incorporated within a system-on-a-chip (SoC) integrated circuit for use in mobile, handheld, or embedded devices.

In one embodiment, the system 100 can include, or be incorporated within a server-based gaming platform, a game console, including a game and media console, a mobile gaming console, a handheld game console, or an online game console. In some embodiments the system 100 is a mobile phone, smart phone, tablet computing device or mobile Internet device. The processing system 100 can also include, couple with, or be integrated within a wearable device, such as a smart watch wearable device, smart eyewear device, augmented reality device, or virtual reality device. In some embodiments, the processing system 100 is a television or set top box device having one or more processors 102 and a graphical interface generated by one or more graphics processors 108.

In some embodiments, the one or more processors 102 each include one or more processor cores 107 to process instructions which, when executed, perform operations for system and user software. In some embodiments, each of the one or more processor cores 107 is configured to process a specific instruction set 109. In some embodiments, instruction set 109 may facilitate Complex Instruction Set Computing (CISC), Reduced Instruction Set Computing (RISC), or computing via a Very Long Instruction Word (VLIW). Multiple processor cores 107 may each process a different instruction set 109, which may include instructions to facilitate the emulation of other instruction sets. Processor core 107 may also include other processing devices, such a Digital Signal Processor (DSP).

In some embodiments, the processor 102 includes cache memory 104. Depending on the architecture, the processor 102 can have a single internal cache or multiple levels of internal cache. In some embodiments, the cache memory is shared among various components of the processor 102. In some embodiments, the processor 102 also uses an external cache (e.g., a Level-3 (L3) cache or Last Level Cache (LLC)) (not shown), which may be shared among processor cores 107 using known cache coherency techniques. A register file 106 is additionally included in processor 102 which may include different types of registers for storing different types of data (e.g., integer registers, floating point registers, status registers, and an instruction pointer register). Some registers may be general-purpose registers, while other registers may be specific to the design of the processor 102.

In some embodiments, one or more processor(s) 102 are coupled with one or more interface bus(es) 110 to transmit communication signals such as address, data, or control signals between processor 102 and other components in the system 100. The interface bus 110, in one embodiment, can be a processor bus, such as a version of the Direct Media Interface (DMI) bus. However, processor busses are not limited to the DMI bus, and may include one or more Peripheral Component Interconnect buses (e.g., PCI, PCI Express), memory busses, or other types of interface busses. In one embodiment the processor(s) 102 include an integrated memory controller 116 and a platform controller hub 130. The memory controller 116 facilitates communication between a memory device and other components of the system 100, while the platform controller hub (PCH) 130 provides connections to I/O devices via a local I/O bus.

The memory device 120 can be a dynamic random access memory (DRAM) device, a static random access memory (SRAM) device, flash memory device, phase-change memory device, or some other memory device having suitable performance to serve as process memory. In one embodiment the memory device 120 can operate as system memory for the system 100, to store data 122 and instructions 121 for use when the one or more processors 102 executes an application or process. Memory controller 116 also couples with an optional external graphics processor 112, which may communicate with the one or more graphics processors 108 in processors 102 to perform graphics and media operations. In some embodiments a display device 111 can connect to the processor(s) 102. The display device 111 can be one or more of an internal display device, as in a mobile electronic device or a laptop device or an external display device attached via a display interface (e.g., DisplayPort, etc.). In one embodiment the display device 111 can be a head mounted display (HMD) such as a stereoscopic display device for use in virtual reality (VR) applications or augmented reality (AR) applications.

In some embodiments the platform controller hub 130 enables peripherals to connect to memory device 120 and processor 102 via a high-speed I/O bus. The I/O peripherals include, but are not limited to, an audio controller 146, a network controller 134, a firmware interface 128, a wireless transceiver 126, touch sensors 125, a data storage device 124 (e.g., hard disk drive, flash memory, etc.). The data storage device 124 can connect via a storage interface (e.g., SATA) or via a peripheral bus, such as a Peripheral Component Interconnect bus (e.g., PCI, PCI Express). The touch sensors 125 can include touch screen sensors, pressure sensors, or fingerprint sensors. The wireless transceiver 126 can be a Wi-Fi transceiver, a Bluetooth transceiver, or a mobile network transceiver such as a 3G, 4G, or Long Term Evolution (LTE) transceiver. The firmware interface 128 enables communication with system firmware, and can be, for example, a unified extensible firmware interface (UEFI). The network controller 134 can enable a network connection to a wired network. In some embodiments, a high-performance network controller (not shown) couples with the interface bus 110. The audio controller 146, in one embodiment, is a multi-channel high definition audio controller. In one embodiment the system 100 includes an optional legacy I/O controller 140 for coupling legacy (e.g., Personal System 2 (PS/2)) devices to the system. The platform controller hub 130 can also connect to one or more Universal Serial Bus (USB) controllers 142 connect input devices, such as keyboard and mouse 143 combinations, a camera 144, or other USB input devices.

It will be appreciated that the system 100 shown is exemplary and not limiting, as other types of data processing systems that are differently configured may also be used. For example, an instance of the memory controller 116 and platform controller hub 130 may be integrated into a discreet external graphics processor, such as the external graphics processor 112. In one embodiment the platform controller hub 130 and/or memory controller 160 may be external to the one or more processor(s) 102. For example, the system 100 can include an external memory controller 116 and platform controller hub 130, which may be configured as a memory controller hub and peripheral controller hub within a system chipset that is in communication with the processor (s) 102.

Figure 2:
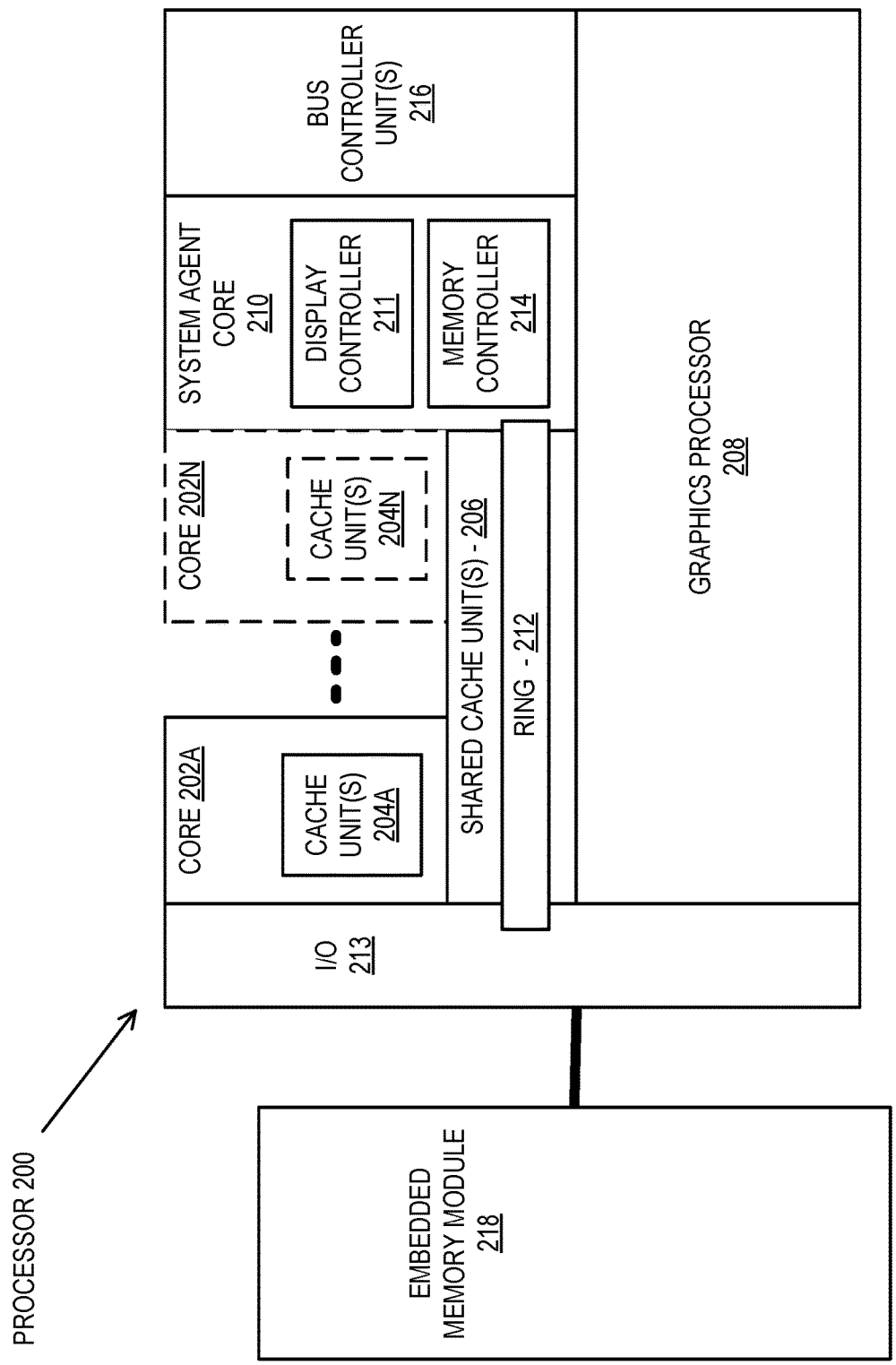
FIGS. 2, 3, 4, and 5 illustrate various components of processers in accordance with some embodiments.

FIG. 2 is a block diagram of an embodiment of a processor 200 having one or more processor cores 202A-202N, an integrated memory controller 214, and an integrated graphics processor 208. Those elements of FIG. 2 having the same reference numbers (or names) as the elements of any other figure herein can operate or function in any manner similar to that described elsewhere herein, but are not limited to such. Processor 200 can include additional cores up to and including additional core 202N represented by the dashed lined boxes. Each of processor cores 202A-202N includes one or more internal cache units 204A-204N. In some embodiments each processor core also has access to one or more shared cached units 206.

The internal cache units 204A-204N and shared cache units 206 represent a cache memory hierarchy within the processor 200. The cache memory hierarchy may include at least one level of instruction and data cache within each processor core and one or more levels of shared mid-level cache, such as a Level 2 (L2), Level 3 (L3), Level 4 (L4), or other levels of cache, where the highest level of cache before external memory is classified as the LLC. In some embodiments, cache coherency logic maintains coherency between the various cache units 206 and 204A-204N.

In some embodiments, processor 200 may also include a set of one or more bus controller units 216 and a system agent core 210. The one or more bus controller units 216 manage a set of peripheral buses, such as one or more PCI or PCI express busses. System agent core 210 provides management functionality for the various processor components. In some embodiments, system agent core 210 includes one or more integrated memory controllers 214 to manage access to various external memory devices (not shown).

In some embodiments, one or more of the processor cores 202A-202N include support for simultaneous multi-threading. In such embodiment, the system agent core 210 includes components for coordinating and operating cores 202A-202N during multi-threaded processing. System agent core 210 may additionally include a power control unit (PCU), which includes logic and components to regulate the power state of processor cores 202A-202N and graphics processor 208.

In some embodiments, processor 200 additionally includes graphics processor 208 to execute graphics processing operations. In some embodiments, the graphics processor 208 couples with the set of shared cache units 206, and the system agent core 210, including the one or more integrated memory controllers 214. In some embodiments, the system agent core 210 also includes a display controller 211 to drive graphics processor output to one or more coupled displays. In some embodiments, display controller 211 may also be a separate module coupled with the graphics processor via at least one interconnect, or may be integrated within the graphics processor 208.

In some embodiments, a ring based interconnect unit 212 is used to couple the internal components of the processor 200. However, an alternative interconnect unit may be used, such as a point-to-point interconnect, a switched interconnect, or other techniques, including techniques well known in the art. In some embodiments, graphics processor 208 couples with the ring interconnect 212 via an I/O link 213.

The exemplary I/O link 213 represents at least one of multiple varieties of I/O interconnects, including an on package I/O interconnect which facilitates communication between various processor components and a high-performance embedded memory module 218, such as an eDRAM module. In some embodiments, each of the processor cores 202A-202N and graphics processor 208 use embedded memory modules 218 as a shared Last Level Cache.

In some embodiments, processor cores 202A-202N are homogenous cores executing the same instruction set architecture. In another embodiment, processor cores 202A-202N are heterogeneous in terms of instruction set architecture (ISA), where one or more of processor cores 202A-202N execute a first instruction set, while at least one of the other cores executes a subset of the first instruction set or a different instruction set. In one embodiment processor cores 202A-202N are heterogeneous in terms of microarchitecture, where one or more cores having a relatively higher power consumption couple with one or more power cores having a lower power consumption. Additionally, processor 200 can be implemented on one or more chips or as an SoC integrated circuit having the illustrated components, in addition to other components.

Figure 3:
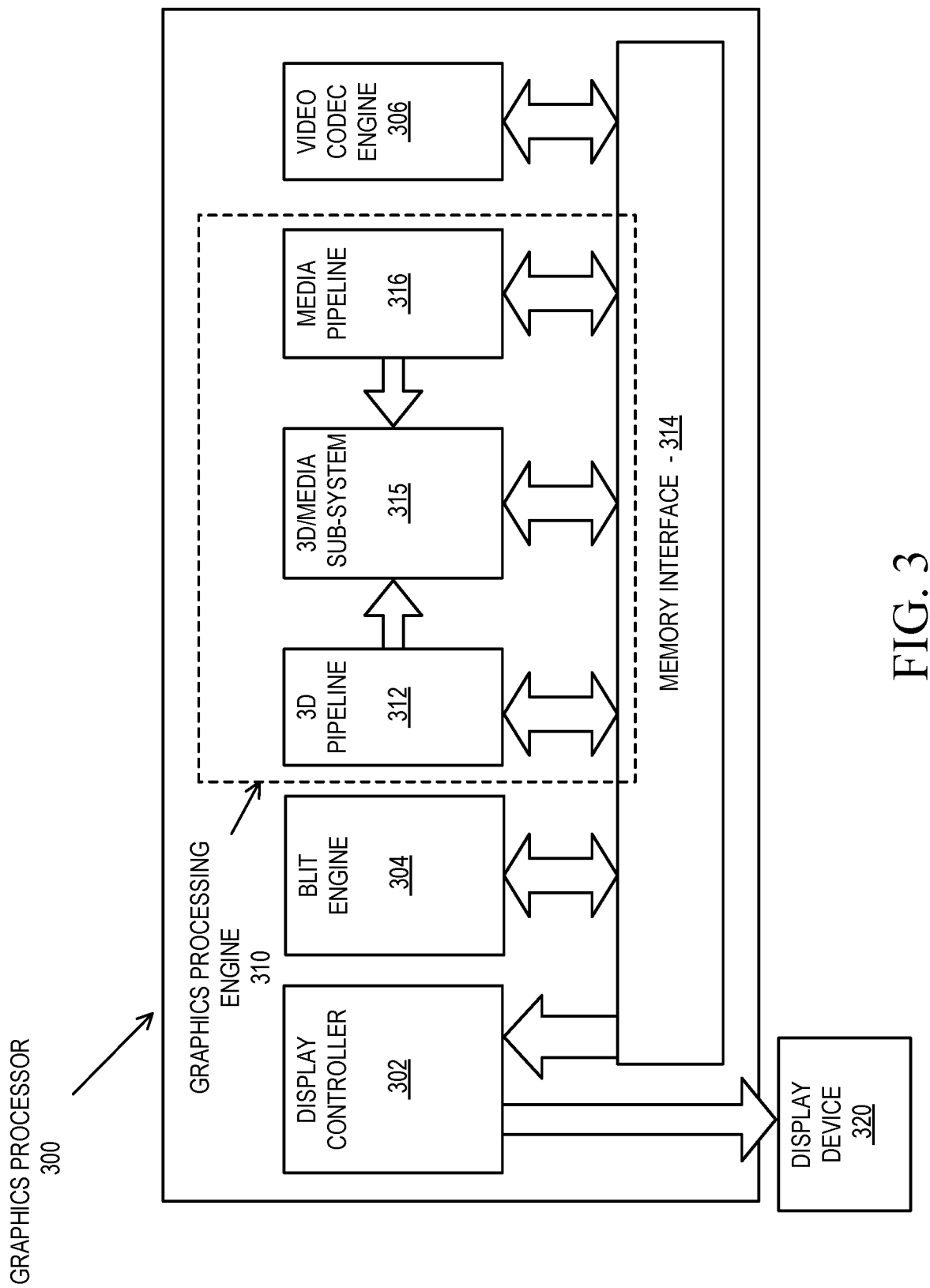

FIG. 3 is a block diagram of a graphics processor 300, which may be a discrete graphics processing unit, or may be a graphics processor integrated with a plurality of processing cores. In some embodiments, the graphics processor communicates via a memory mapped I/O interface to registers on the graphics processor and with commands placed into the processor memory. In some embodiments, graphics processor 300 includes a memory interface 314 to access memory. Memory interface 314 can be an interface to local memory, one or more internal caches, one or more shared external caches, and/or to system memory.

In some embodiments, graphics processor 300 also includes a display controller 302 to drive display output data to a display device 320. Display controller 302 includes hardware for one or more overlay planes for the display and composition of multiple layers of video or user interface elements. The display device 320 can be an internal or external display device. In one embodiment the display device 320 is a head mounted display device, such as a virtual reality (VR) display device or an augmented reality (AR) display device. In some embodiments, graphics processor 300 includes a video codec engine 306 to encode, decode, or transcode media to, from, or between one or more media encoding formats, including, but not limited to Moving Picture Experts Group (MPEG) formats such as MPEG-2, Advanced Video Coding (AVC) formats such as H.264/MPEG-4 AVC, as well as the Society of Motion Picture & Television Engineers (SMPTE) 421M/VC-1, and Joint Photographic Experts Group (JPEG) formats such as JPEG, and Motion JPEG (MJPEG) formats.

In some embodiments, graphics processor 300 includes a block image transfer (BLIT) engine 304 to perform two-dimensional (2D) rasterizer operations including, for example, bit-boundary block transfers. However, in one embodiment, 2D graphics operations are performed using one or more components of graphics processing engine (GPE) 310. In some embodiments, GPE 310 is a compute engine for performing graphics operations, including three-dimensional (3D) graphics operations and media operations.

In some embodiments, GPE 310 includes a 3D pipeline 312 for performing 3D operations, such as rendering three-dimensional images and scenes using processing functions that act upon 3D primitive shapes (e.g., rectangle, triangle, etc.). The 3D pipeline 312 includes programmable and fixed function elements that perform various tasks within the element and/or spawn execution threads to a 3D/Media sub-system 315. While 3D pipeline 312 can be used to perform media operations, an embodiment of GPE 310 also includes a media pipeline 316 that is specifically used to perform media operations, such as video post-processing and image enhancement.

In some embodiments, media pipeline 316 includes fixed function or programmable logic units to perform one or more specialized media operations, such as video decode acceleration, video de-interlacing, and video encode acceleration in place of, or on behalf of video codec engine 306. In some embodiments, media pipeline 316 additionally includes a thread spawning unit to spawn threads for execution on 3D/Media sub-system 315. The spawned threads perform computations for the media operations on one or more graphics execution units included in 3D/Media subsystem 315.

In some embodiments, 3D/Media subsystem 315 includes logic for executing threads spawned by 3D pipeline 312 and media pipeline 316. In one embodiment, the pipelines send thread execution requests to 3D/Media subsystem 315, which includes thread dispatch logic for arbitrating and dispatching the various requests to available thread execution resources. The execution resources include an array of graphics execution units to process the 3D and media threads. In some embodiments, 3D/Media subsystem 315 includes one or more internal caches for thread instructions and data. In some embodiments, the subsystem also includes shared memory, including registers and addressable memory, to share data between threads and to store output data.

Graphics Processing Engine

Figure 4:
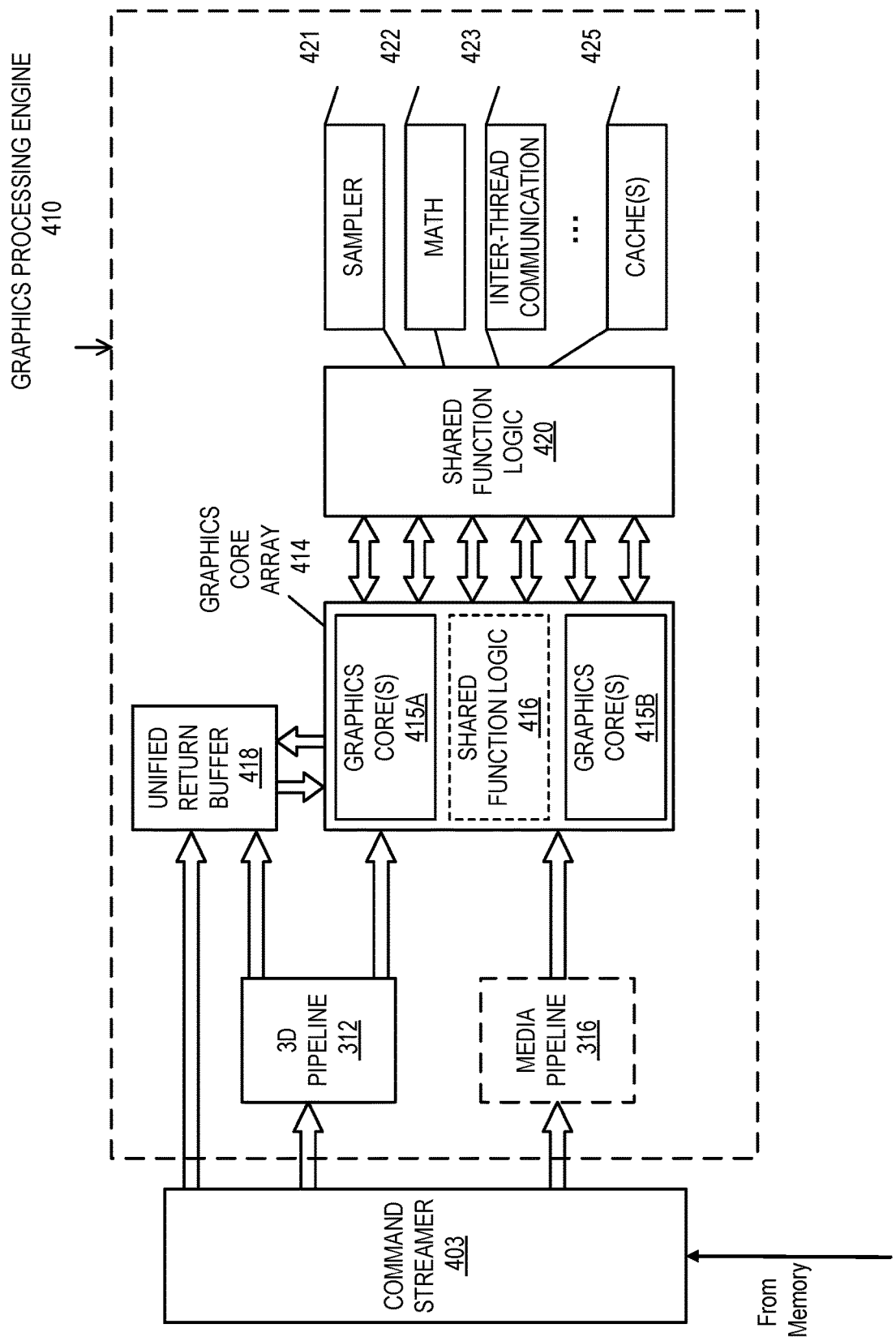

FIG. 4 is a block diagram of a graphics processing engine 410 of a graphics processor in accordance with some embodiments. In one embodiment, the graphics processing engine (GPE) 410 is a version of the GPE 310 shown in FIG. 3. Elements of FIG. 4 having the same reference numbers (or names) as the elements of any other figure herein can operate or function in any manner similar to that described elsewhere herein, but are not limited to such. For example, the 3D pipeline 312 and media pipeline 316 of FIG. 3 are illustrated. The media pipeline 316 is optional in some embodiments of the GPE 410 and may not be explicitly included within the GPE 410. For example and in at least one embodiment, a separate media and/or image processor is coupled to the GPE 410.

In some embodiments, GPE 410 couples with or includes a command streamer 403, which provides a command stream to the 3D pipeline 312 and/or media pipelines 316. In some embodiments, command streamer 403 is coupled with memory, which can be system memory, or one or more of internal cache memory and shared cache memory. In some embodiments, command streamer 403 receives commands from the memory and sends the commands to 3D pipeline 312 and/or media pipeline 316. The commands are directives fetched from a ring buffer, which stores commands for the 3D pipeline 312 and media pipeline 316. In one embodiment, the ring buffer can additionally include batch command buffers storing batches of multiple commands. The commands for the 3D pipeline 312 can also include references to data stored in memory, such as but not limited to vertex and geometry data for the 3D pipeline 312 and/or image data and memory objects for the media pipeline 316. The 3D pipeline 312 and media pipeline 316 process the commands and data by performing operations via logic within the respective pipelines or by dispatching one or more execution threads to a graphics core array 414. In one embodiment the graphics core array 414 include one or more blocks of graphics cores (e.g., graphics core(s) 415A, graphics core(s) 415B), each block including one or more graphics cores. Each graphics core includes a set of graphics execution resources that includes general-purpose and graphics specific execution logic to perform graphics and compute operations, as well as fixed function texture processing and/or machine learning and artificial intelligence acceleration logic.

In various embodiments the 3D pipeline 312 includes fixed function and programmable logic to process one or more shader programs, such as vertex shaders, geometry shaders, pixel shaders, fragment shaders, compute shaders, or other shader programs, by processing the instructions and dispatching execution threads to the graphics core array 414. The graphics core array 414 provides a unified block of execution resources for use in processing these shader programs. Multi-purpose execution logic (e.g., execution units) within the graphics core(s) 415A-414B of the graphic core array 414 includes support for various 3D API shader languages and can execute multiple simultaneous execution threads associated with multiple shaders.

In some embodiments the graphics core array 414 also includes execution logic to perform media functions, such as video and/or image processing. In one embodiment, the execution units additionally include general-purpose logic that is programmable to perform parallel general-purpose computational operations, in addition to graphics processing operations. The general-purpose logic can perform processing operations in parallel or in conjunction with general-purpose logic within the processor core(s) 107 of FIG. 1 or core 202A-202N as in FIG. 2.

Output data generated by threads executing on the graphics core array 414 can output data to memory in a unified return buffer (URB) 418. The URB 418 can store data for multiple threads. In some embodiments the URB 418 may be used to send data between different threads executing on the graphics core array 414. In some embodiments the URB 418 may additionally be used for synchronization between threads on the graphics core array and fixed function logic within the shared function logic 420.

In some embodiments, graphics core array 414 is scalable, such that the array includes a variable number of graphics cores, each having a variable number of execution units based on the target power and performance level of GPE 410. In one embodiment the execution resources are dynamically scalable, such that execution resources may be enabled or disabled as needed.

The graphics core array 414 couples with shared function logic 420 that includes multiple resources that are shared between the graphics cores in the graphics core array. The shared functions within the shared function logic 420 are hardware logic units that provide specialized supplemental functionality to the graphics core array 414. In various embodiments, shared function logic 420 includes but is not limited to sampler 421, math 422, and inter-thread communication (ITC) 423 logic. Additionally, some embodiments implement one or more cache(s) 425 within the shared function logic 420.

A shared function is implemented where the demand for a given specialized function is insufficient for inclusion within the graphics core array 414. Instead a single instantiation of that specialized function is implemented as a stand-alone entity in the shared function logic 420 and shared among the execution resources within the graphics core array 414. The precise set of functions that are shared between the graphics core array 414 and included within the graphics core array 414 varies across embodiments. In some embodiments, specific shared functions within the shared function logic 420 that are used extensively by the graphics core array 414 may be included within shared function logic 416 within the graphics core array 414. In various embodiments, the shared function logic 416 within the graphics core array 414 can include some or all logic within the shared function logic 420. In one embodiment, all logic elements within the shared function logic 420 may be duplicated within the shared function logic 416 of the graphics core array 414. In one embodiment the shared function logic 420 is excluded in favor of the shared function logic 416 within the graphics core array 414.

Figure 5:
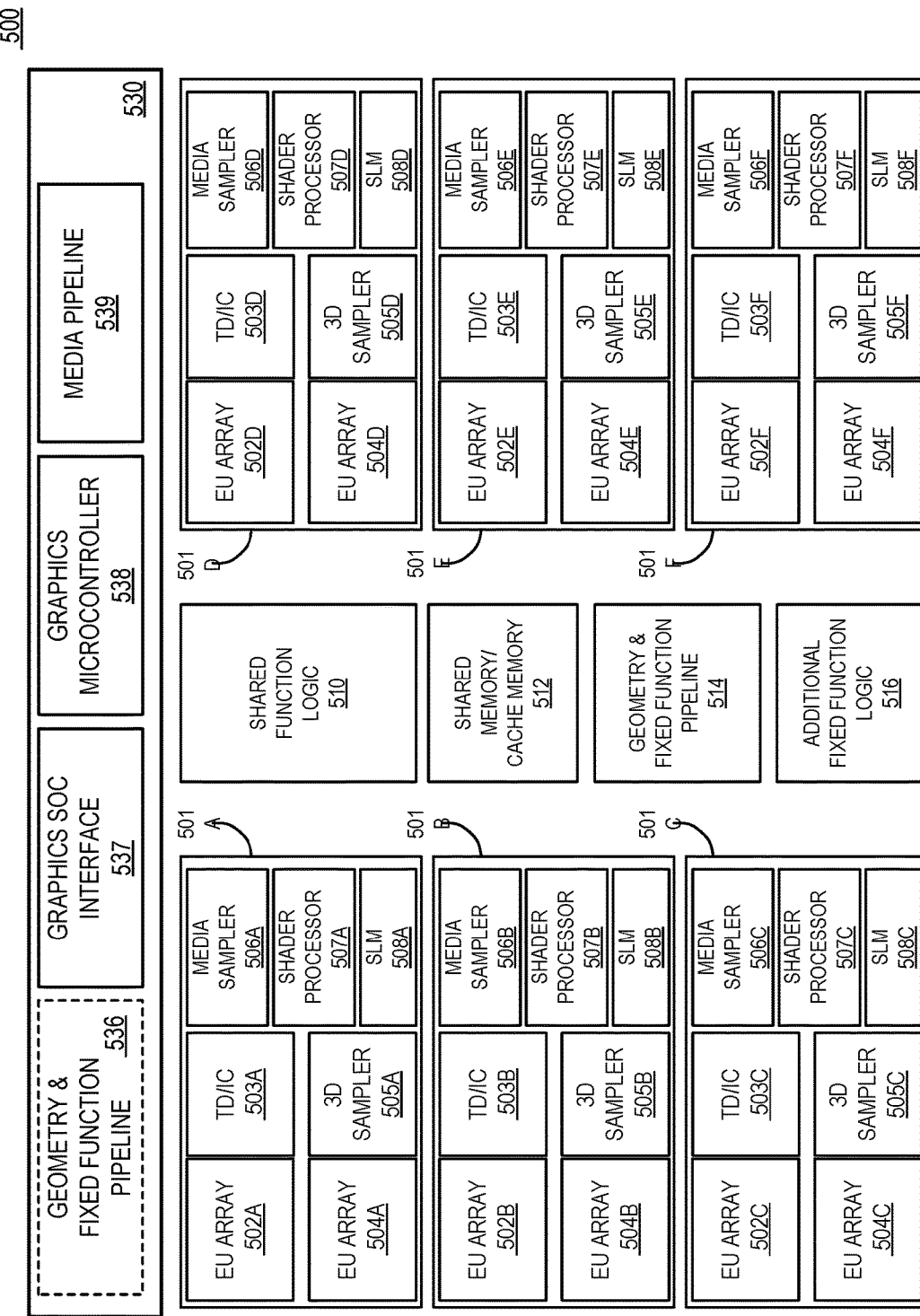

FIG. 5 is a block diagram of hardware logic of a graphics processor core 500, according to some embodiments described herein. Elements of FIG. 5 having the same reference numbers (or names) as the elements of any other figure herein can operate or function in any manner similar to that described elsewhere herein, but are not limited to such. The illustrated graphics processor core 500, in some embodiments, is included within the graphics core array 414 of FIG. 4. The graphics processor core 500, sometimes referred to as a core slice, can be one or multiple graphics cores within a modular graphics processor. The graphics processor core 500 is exemplary of one graphics core slice, and a graphics processor as described herein may include multiple graphics core slices based on target power and performance envelopes. Each graphics core 500 can include a fixed function block 530 coupled with multiple sub-cores 501A-501F, also referred to as sub-slices, that include modular blocks of general-purpose and fixed function logic.

In some embodiments the fixed function block 530 includes a geometry/fixed function pipeline 536 that can be shared by all sub-cores in the graphics processor 500, for example, in lower performance and/or lower power graphics processor implementations. In various embodiments, the geometry/fixed function pipeline 536 includes a 3D fixed function pipeline (e.g., 3D pipeline 312 as in FIG. 3 and FIG. 4) a video front-end unit, a thread spawner and thread dispatcher, and a unified return buffer manager, which manages unified return buffers, such as the unified return buffer 418 of FIG. 4.

In one embodiment the fixed function block 530 also includes a graphics SoC interface 537, a graphics microcontroller 538, and a media pipeline 539. The graphics SoC interface 537 provides an interface between the graphics core 500 and other processor cores within a system on a chip integrated circuit. The graphics microcontroller 538 is a programmable sub-processor that is configurable to manage various functions of the graphics processor 500, including thread dispatch, scheduling, and pre-emption. The media pipeline 539 (e.g., media pipeline 316 of FIG. 3 and FIG. 4) includes logic to facilitate the decoding, encoding, pre-processing, and/or post-processing of multimedia data, including image and video data. The media pipeline 539 implement media operations via requests to compute or sampling logic within the sub-cores 501-501F.

In one embodiment the SoC interface 537 enables the graphics core 500 to communicate with general-purpose application processor cores (e.g., CPUs) and/or other components within an SoC, including memory hierarchy elements such as a shared last level cache memory, the system RAM, and/or embedded on-chip or on-package DRAM. The SoC interface 537 can also enable communication with fixed function devices within the SoC, such as camera imaging pipelines, and enables the use of and/or implements global memory atomics that may be shared between the graphics core 500 and CPUs within the SoC. The SoC interface 537 can also implement power management controls for the graphics core 500 and enable an interface between a clock domain of the graphic core 500 and other clock domains within the SoC. In one embodiment the SoC interface 537 enables receipt of command buffers from a command streamer and global thread dispatcher that are configured to provide commands and instructions to each of one or more graphics cores within a graphics processor. The commands and instructions can be dispatched to the media pipeline 539, when media operations are to be performed, or a geometry and fixed function pipeline (e.g., geometry and fixed function pipeline 536, geometry and fixed function pipeline 514) when graphics processing operations are to be performed.

The graphics microcontroller 538 can be configured to perform various scheduling and management tasks for the graphics core 500. In one embodiment the graphics microcontroller 538 can perform graphics and/or compute workload scheduling on the various graphics parallel engines within execution unit (EU) arrays 502A-502F, 504A-504F within the sub-cores 501A-501F. In this scheduling model, host software executing on a CPU core of an SoC including the graphics core 500 can submit workloads one of multiple graphic processor doorbells, which invokes a scheduling operation on the appropriate graphics engine. Scheduling operations include determining which workload to run next, submitting a workload to a command streamer, pre-empting existing workloads running on an engine, monitoring progress of a workload, and notifying host software when a workload is complete. In one embodiment the graphics microcontroller 538 can also facilitate low-power or idle states for the graphics core 500, providing the graphics core 500 with the ability to save and restore registers within the graphics core 500 across low-power state transitions independently from the operating system and/or graphics driver software on the system.

The graphics core 500 may have greater than or fewer than the illustrated sub-cores 501A-501F, up to N modular sub-cores. For each set of N sub-cores, the graphics core 500 can also include shared function logic 510, shared and/or cache memory 512, a geometry/fixed function pipeline 514, as well as additional fixed function logic 516 to accelerate various graphics and compute processing operations. The shared function logic 510 can include logic units associated with the shared function logic 420 of FIG. 4 (e.g., sampler, math, and/or inter-thread communication logic) that can be shared by each N sub-cores within the graphics core 500. The shared and/or cache memory 512 can be a last-level cache for the set of N sub-cores 501A-501F within the graphics core 500, and can also serve as shared memory that is accessible by multiple sub-cores. The geometry/fixed function pipeline 514 can be included instead of the geometry/fixed function pipeline 536 within the fixed function block 530 and can include the same or similar logic units.

In one embodiment the graphics core 500 includes additional fixed function logic 516 that can include various fixed function acceleration logic for use by the graphics core 500. In one embodiment the additional fixed function logic 516 includes an additional geometry pipeline for use in position only shading. In position-only shading, two geometry pipelines exist, the full geometry pipeline within the geometry/fixed function pipeline 516, 536, and a cull pipeline, which is an additional geometry pipeline which may be included within the additional fixed function logic 516. In one embodiment the cull pipeline is a trimmed down version of the full geometry pipeline. The full pipeline and the cull pipeline can execute different instances of the same application, each instance having a separate context. Position only shading can hide long cull runs of discarded triangles, enabling shading to be completed earlier in some instances. For example and in one embodiment the cull pipeline logic within the additional fixed function logic 516 can execute position shaders in parallel with the main application and generally generates critical results faster than the full pipeline, as the cull pipeline fetches and shades only the position attribute of the vertices, without performing rasterization and rendering of the pixels to the frame buffer. The cull pipeline can use the generated critical results to compute visibility information for all the triangles without regard to whether those triangles are culled. The full pipeline (which in this instance may be referred to as a replay pipeline) can consume the visibility information to skip the culled triangles to shade only the visible triangles that are finally passed to the rasterization phase.

In one embodiment the additional fixed function logic 516 can also include machine-learning acceleration logic, such as fixed function matrix multiplication logic, for implementations including optimizations for machine learning training or inferencing.

Within each graphics sub-core 501A-501F includes a set of execution resources that may be used to perform graphics, media, and compute operations in response to requests by graphics pipeline, media pipeline, or shader programs. The graphics sub-cores 501A-501F include multiple EU arrays 502A-502F, 504A-504F, thread dispatch and inter-thread communication (TD/IC) logic 503A-503F, a 3D (e.g., texture) sampler 505A-505F, a media sampler 506A-506F, a shader processor 507A-507F, and shared local memory (SLM) 508A-508F. The EU arrays 502A-502F, 504A-504F each include multiple execution units, which are general-purpose graphics processing units capable of performing floating-point and integer/fixed-point logic operations in service of a graphics, media, or compute operation, including graphics, media, or compute shader programs. The TD/IC logic 503A-503F performs local thread dispatch and thread control operations for the execution units within a sub-core and facilitate communication between threads executing on the execution units of the sub-core. The 3D sampler 505A-505F can read texture or other 3D graphics related data into memory. The 3D sampler can read texture data differently based on a configured sample state and the texture format associated with a given texture. The media sampler 506A-506F can perform similar read operations based on the type and format associated with media data. In one embodiment, each graphics sub-core 501A-501F can alternately include a unified 3D and media sampler. Threads executing on the execution units within each of the sub-cores 501A-501F can make use of shared local memory 508A-508F within each sub-core, to enable threads executing within a thread group to execute using a common pool of on-chip memory.

Execution Units

Figure 6A:
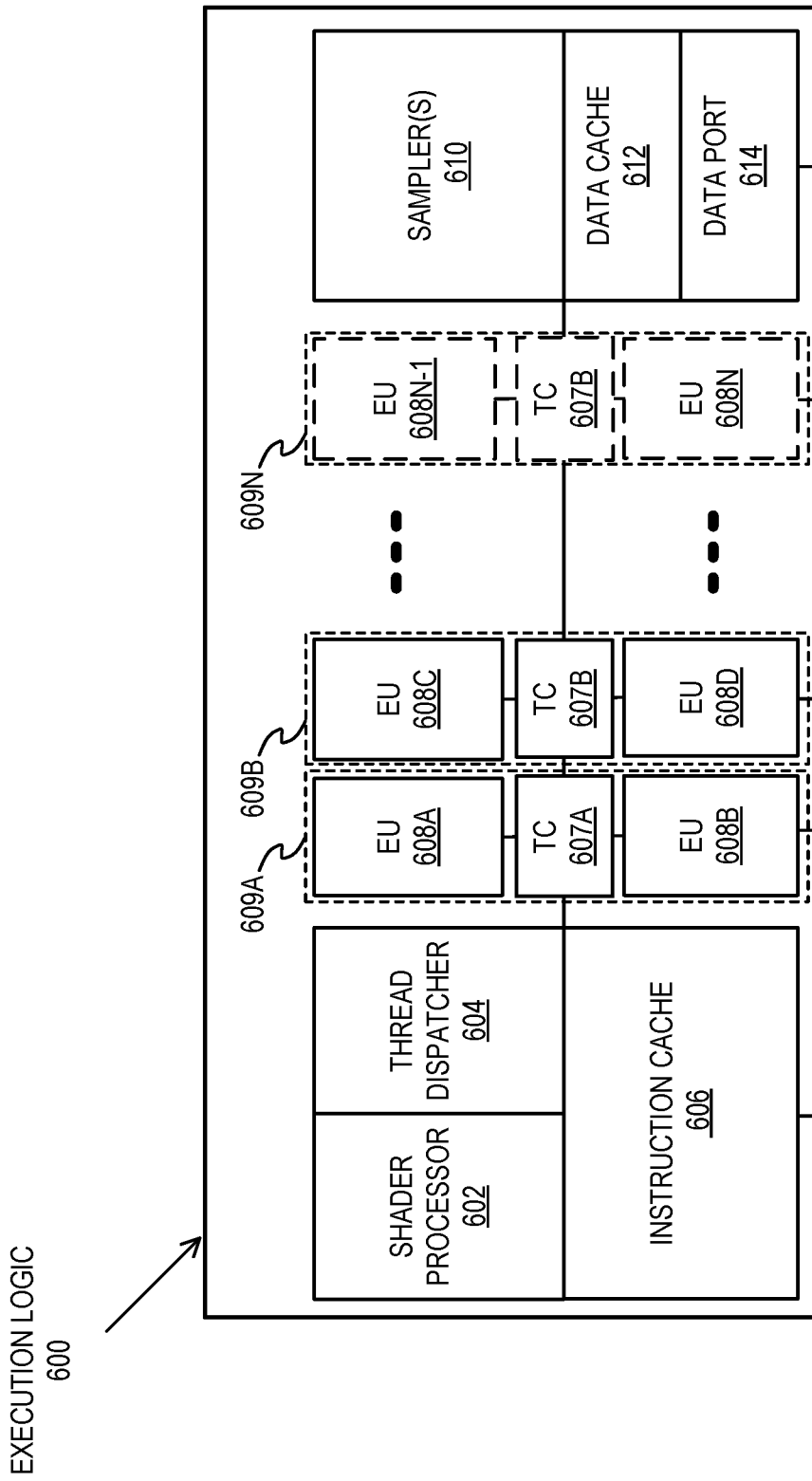
FIGS. 6A and 6B illustrate thread execution logic including an array of processing elements employed in a graphics processor core according to embodiments described herein.
Figure 6B:
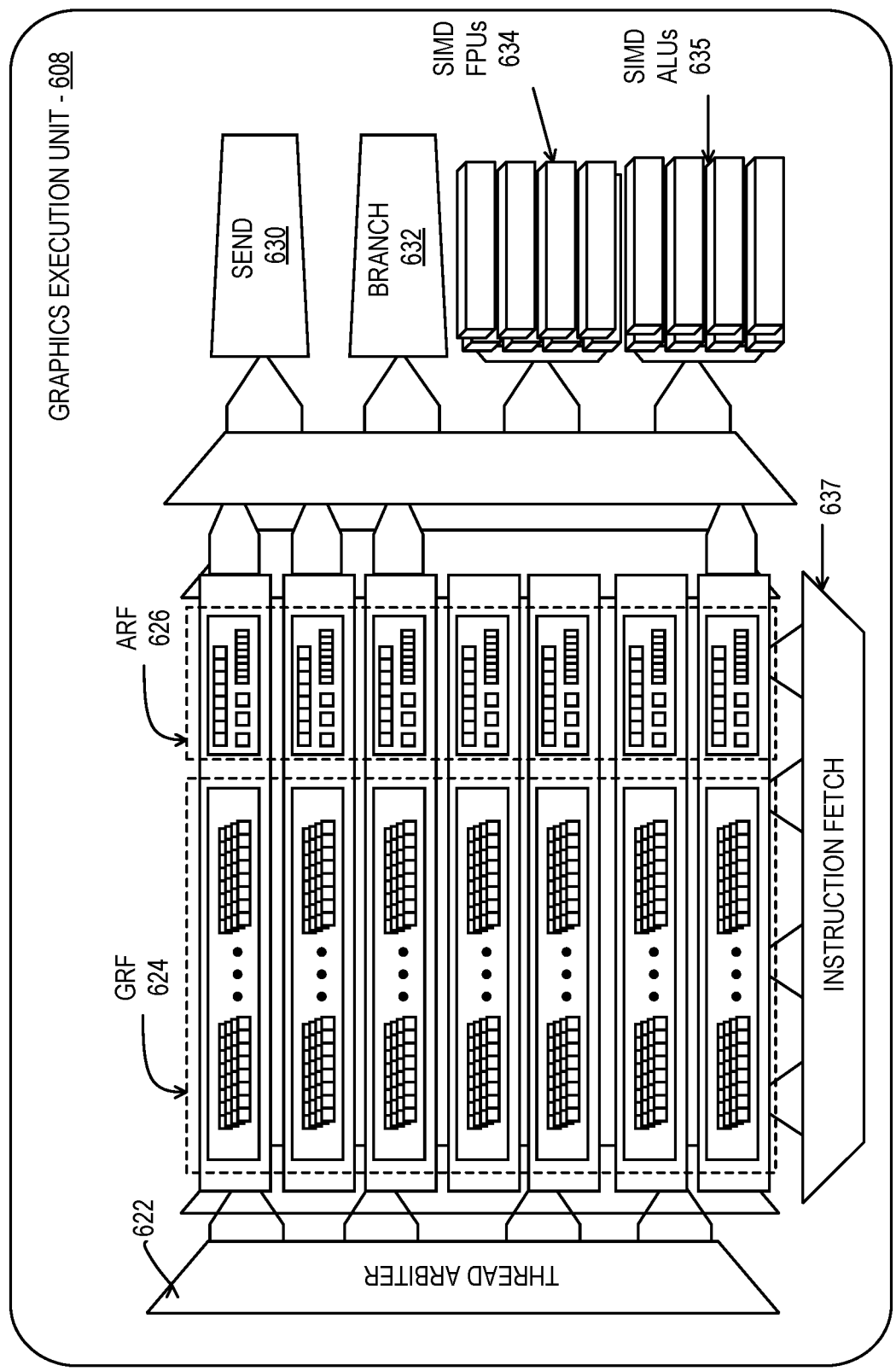

FIGS. 6A-6B illustrate thread execution logic 600 including an array of processing elements employed in a graphics processor core according to embodiments described herein. Elements of FIGS. 6A-6B having the same reference numbers (or names) as the elements of any other figure herein can operate or function in any manner similar to that described elsewhere herein, but are not limited to such. FIG. 6A illustrates an overview of thread execution logic 600, which can include a variant of the hardware logic illustrated with each sub-core 501A-501F of FIG. 5. FIG. 6B illustrates exemplary internal details of an execution unit.

As illustrated in FIG. 6A, in some embodiments thread execution logic 600 includes a shader processor 602, a thread dispatcher 604, instruction cache 606, a scalable execution unit array including a plurality of execution units 608A-608N, a sampler 610, a data cache 612, and a data port 614. In one embodiment the scalable execution unit array can dynamically scale by enabling or disabling one or more execution units (e.g., any of execution unit 608A, 608B, 608C, 608D, through 608N-1 and 608N) based on the computational requirements of a workload. In one embodiment the included components are interconnected via an interconnect fabric that links to each of the components. In some embodiments, thread execution logic 600 includes one or more connections to memory, such as system memory or cache memory, through one or more of instruction cache 606, data port 614, sampler 610, and execution units 608A-608N. In some embodiments, each execution unit (e.g. 608A) is a stand-alone programmable general-purpose computational unit that is capable of executing multiple simultaneous hardware threads while processing multiple data elements in parallel for each thread. In various embodiments, the array of execution units 608A-608N is scalable to include any number individual execution units.

In some embodiments, the execution units 608A-608N are primarily used to execute shader programs. A shader processor 602 can process the various shader programs and dispatch execution threads associated with the shader programs via a thread dispatcher 604. In one embodiment the thread dispatcher includes logic to arbitrate thread initiation requests from the graphics and media pipelines and instantiate the requested threads on one or more execution unit in the execution units 608A-608N. For example, a geometry pipeline can dispatch vertex, tessellation, or geometry shaders to the thread execution logic for processing. In some embodiments, thread dispatcher 604 can also process runtime thread spawning requests from the executing shader programs.

In some embodiments, the execution units 608A-608N support an instruction set that includes native support for many standard 3D graphics shader instructions, such that shader programs from graphics libraries (e.g., Direct 3D and OpenGL) are executed with a minimal translation. The execution units support vertex and geometry processing (e.g., vertex programs, geometry programs, vertex shaders), pixel processing (e.g., pixel shaders, fragment shaders) and general-purpose processing (e.g., compute and media shaders). Each of the execution units 608A-608N is capable of multi-issue single instruction multiple data (SIMD) execution and multi-threaded operation enables an efficient execution environment in the face of higher latency memory accesses. Each hardware thread within each execution unit has a dedicated high-bandwidth register file and associated independent thread-state. Execution is multi-issue per clock to pipelines capable of integer, single and double precision floating point operations, SIMD branch capability, logical operations, transcendental operations, and other miscellaneous operations. While waiting for data from memory or one of the shared functions, dependency logic within the execution units 608A-608N causes a waiting thread to sleep until the requested data has been returned. While the waiting thread is sleeping, hardware resources may be devoted to processing other threads. For example, during a delay associated with a vertex shader operation, an execution unit can perform operations for a pixel shader, fragment shader, or another type of shader program, including a different vertex shader.

Each execution unit in execution units 608A-608N operates on arrays of data elements. The number of data elements is the "execution size," or the number of channels for the instruction. An execution channel is a logical unit of execution for data element access, masking, and flow control within instructions. The number of channels may be independent of the number of physical Arithmetic Logic Units (ALUs) or Floating Point Units (FPUs) for a particular graphics processor. In some embodiments, execution units 608A-608N support integer and floating-point data types.

The execution unit instruction set includes SIMD instructions. The various data elements can be stored as a packed data type in a register and the execution unit will process the various elements based on the data size of the elements. For example, when operating on a 256-bit wide vector, the 256 bits of the vector are stored in a register and the execution unit operates on the vector as four separate 64-bit packed data elements (Quad-Word (QW) size data elements), eight separate 32-bit packed data elements (Double Word (DW) size data elements), sixteen separate 16-bit packed data elements (Word (W) size data elements), or thirty-two separate 8-bit data elements (byte (B) size data elements). However, different vector widths and register sizes are possible.

In one embodiment one or more execution units can be combined into a fused execution unit 609A-609N having thread control logic (607A-607N) that is common to the fused EUs. Multiple EUs can be fused into an EU group. Each EU in the fused EU group can be configured to execute a separate SIMD hardware thread. The number of EUs in a fused EU group can vary according to embodiments. Additionally, various SIMD widths can be performed per-EU, including but not limited to SIMD8, SIMD16, and SIMD32. Each fused graphics execution unit 609A-609N includes at least two execution units. For example, fused execution unit 609A includes a first EU 608A, second EU 608B, and thread control logic 607A that is common to the first EU 608A and the second EU 608B. The thread control logic 607A controls threads executed on the fused graphics execution unit 609A, allowing each EU within the fused execution units 609A-609N to execute using a common instruction pointer register.

One or more internal instruction caches (e.g., 606) are included in the thread execution logic 600 to cache thread instructions for the execution units. In some embodiments, one or more data caches (e.g., 612) are included to cache thread data during thread execution. In some embodiments, a sampler 610 is included to provide texture sampling for 3D operations and media sampling for media operations. In some embodiments, sampler 610 includes specialized texture or media sampling functionality to process texture or media data during the sampling process before providing the sampled data to an execution unit.

During execution, the graphics and media pipelines send thread initiation requests to thread execution logic 600 via thread spawning and dispatch logic. Once a group of geometric objects has been processed and rasterized into pixel data, pixel processor logic (e.g., pixel shader logic, fragment shader logic, etc.) within the shader processor 602 is invoked to further compute output information and cause results to be written to output surfaces (e.g., color buffers, depth buffers, stencil buffers, etc.). In some embodiments, a pixel shader or fragment shader calculates the values of the various vertex attributes that are to be interpolated across the rasterized object. In some embodiments, pixel processor logic within the shader processor 602 then executes an application programming interface (API)-supplied pixel or fragment shader program. To execute the shader program, the shader processor 602 dispatches threads to an execution unit (e.g., 608A) via thread dispatcher 604. In some embodiments, shader processor 602 uses texture sampling logic in the sampler 610 to access texture data in texture maps stored in memory. Arithmetic operations on the texture data and the input geometry data compute pixel color data for each geometric fragment, or discards one or more pixels from further processing.

In some embodiments, the data port 614 provides a memory access mechanism for the thread execution logic 600 to output processed data to memory for further processing on a graphics processor output pipeline. In some embodiments, the data port 614 includes or couples to one or more cache memories (e.g., data cache 612) to cache data for memory access via the data port.

As illustrated in FIG. 6B, a graphics execution unit 608 can include an instruction fetch unit 637, a general register file array (GRF) 624, an architectural register file array (ARF) 626, a thread arbiter 622, a send unit 630, a branch unit 632, a set of SIMD floating point units (FPUs) 634, and in one embodiment a set of dedicated integer SIMD ALUs 635. The GRF 624 and ARF 626 includes the set of general register files and architecture register files associated with each simultaneous hardware thread that may be active in the graphics execution unit 608. In one embodiment, per thread architectural state is maintained in the ARF 626, while data used during thread execution is stored in the GRF 624. The execution state of each thread, including the instruction pointers for each thread, can be held in thread-specific registers in the ARF 626.

In one embodiment the graphics execution unit 608 has an architecture that is a combination of Simultaneous Multi-Threading (SMT) and fine-grained Interleaved Multi-Threading (IMT). The architecture has a modular configuration that can be fine-tuned at design time based on a target number of simultaneous threads and number of registers per execution unit, where execution unit resources are divided across logic used to execute multiple simultaneous threads.

In one embodiment, the graphics execution unit 608 can co-issue multiple instructions, which may each be different instructions. The thread arbiter 622 of the graphics execution unit thread 608 can dispatch the instructions to one of the send unit 630, branch unit 642, or SIMD FPU(s) 634 for execution. Each execution thread can access 128 general-purpose registers within the GRF 624, where each register can store 32 bytes, accessible as a SIMD 8-element vector of 32-bit data elements. In one embodiment, each execution unit thread has access to 4 Kbytes within the GRF 624, although embodiments are not so limited, and greater or fewer register resources may be provided in other embodiments. In one embodiment up to seven threads can execute simultaneously, although the number of threads per execution unit can also vary according to embodiments. In an embodiment in which seven threads may access 4 Kbytes, the GRF 624 can store a total of 28 Kbytes. Flexible addressing modes can permit registers to be addressed together to build effectively wider registers or to represent strided rectangular block data structures.

In one embodiment, memory operations, sampler operations, and other longer-latency system communications are dispatched via "send" instructions that are executed by the message passing send unit 630. In one embodiment, branch instructions are dispatched to a dedicated branch unit 632 to facilitate SIMD divergence and eventual convergence.

In one embodiment the graphics execution unit 608 includes one or more SIMD floating point units (FPU(s)) 634 to perform floating-point operations. In one embodiment, the FPU(s) 634 also support integer computation. In one embodiment the FPU(s) 634 can SIMD execute up to M number of 32-bit floating-point (or integer) operations, or SIMD execute up to 2M 16-bit integer or 16-bit floating-point operations. In one embodiment, at least one of the FPU(s) provides extended math capability to support high-throughput transcendental math functions and double precision 64-bit floating-point. In some embodiments, a set of 8-bit integer SIMD ALUs 635 are also present, and may be specifically optimized to perform operations associated with machine learning computations.

In one embodiment, arrays of multiple instances of the graphics execution unit 608 can be instantiated in a graphics sub-core grouping (e.g., a sub-slice). For scalability, product architects can chose the exact number of execution units per sub-core grouping. In one embodiment the execution unit 608 can execute instructions across a plurality of execution channels. In a further embodiment, each thread executed on the graphics execution unit 608 is executed on a different channel.

FIG. 7 is a block diagram illustrating a graphics processor instruction formats 700 according to some embodiments. In one or more embodiment, the graphics processor execution units support an instruction set having instructions in multiple formats. The solid lined boxes illustrate the components that are generally included in an execution unit instruction, while the dashed lines include components that are optional or that are only included in a sub-set of the instructions. In some embodiments, instruction format 700 described and illustrated are macro-instructions, in that they are instructions supplied to the execution unit, as opposed to micro-operations resulting from instruction decode once the instruction is processed.

In some embodiments, the graphics processor execution units natively support instructions in a 128-bit instruction format 710. A 64-bit compacted instruction format 730 is available for some instructions based on the selected instruction, instruction options, and number of operands. The native 128-bit instruction format 710 provides access to all instruction options, while some options and operations are restricted in the 64-bit format 730. The native instructions available in the 64-bit format 730 vary by embodiment. In some embodiments, the instruction is compacted in part using a set of index values in an index field 713. The execution unit hardware references a set of compaction tables based on the index values and uses the compaction table outputs to reconstruct a native instruction in the 128-bit instruction format 710.

For each format, instruction opcode 712 defines the operation that the execution unit is to perform. The execution units execute each instruction in parallel across the multiple data elements of each operand. For example, in response to an add instruction the execution unit performs a simultaneous add operation across each color channel representing a texture element or picture element. By default, the execution unit performs each instruction across all data channels of the operands. In some embodiments, instruction control field 714 enables control over certain execution options, such as channels selection (e.g., predication) and data channel order (e.g., swizzle). For instructions in the 128-bit instruction format 710 an exec-size field 716 limits the number of data channels that will be executed in parallel. In some embodiments, exec-size field 716 is not available for use in the 64-bit compact instruction format 730.

Some execution unit instructions have up to three operands including two source operands, src0 720, src1 722, and one destination 718. In some embodiments, the execution units support dual destination instructions, where one of the destinations is implied. Data manipulation instructions can have a third source operand (e.g., SRC2 724), where the instruction opcode 712 determines the number of source operands. An instruction's last source operand can be an immediate (e.g., hard-coded) value passed with the instruction.

In some embodiments, the 128-bit instruction format 710 includes an access/address mode field 726 specifying, for example, whether direct register addressing mode or indirect register addressing mode is used. When direct register addressing mode is used, the register address of one or more operands is directly provided by bits in the instruction.

In some embodiments, the 128-bit instruction format 710 includes an access/address mode field 726, which specifies an address mode and/or an access mode for the instruction. In one embodiment the access mode is used to define a data access alignment for the instruction. Some embodiments support access modes including a 16-byte aligned access mode and a 1-byte aligned access mode, where the byte alignment of the access mode determines the access alignment of the instruction operands. For example, when in a first mode, the instruction may use byte-aligned addressing for source and destination operands and when in a second mode, the instruction may use 16-byte-aligned addressing for all source and destination operands.

In one embodiment, the address mode portion of the access/address mode field 726 determines whether the instruction is to use direct or indirect addressing. When direct register addressing mode is used bits in the instruction directly provide the register address of one or more operands. When indirect register addressing mode is used, the register address of one or more operands may be computed based on an address register value and an address immediate field in the instruction.

In some embodiments instructions are grouped based on opcode 712 bit-fields to simplify Opcode decode 740. For an 8-bit opcode, bits 4, 5, and 6 allow the execution unit to determine the type of opcode. The precise opcode grouping shown is merely an example. In some embodiments, a move and logic opcode group 742 includes data movement and logic instructions (e.g., move (mov), compare (cmp)). In some embodiments, move and logic group 742 shares the five most significant bits (MSB), where move (mov) instructions are in the form of 0000xxxxb and logic instructions are in the form of 0001xxxxb. A flow control instruction group 744 (e.g., call, jump (jmp)) includes instructions in the form of 0010xxxxb (e.g., 0x20). A miscellaneous instruction group 746 includes a mix of instructions, including synchronization instructions (e.g., wait, send) in the form of 0011xxxxb (e.g., 0x30). A parallel math instruction group 748 includes component-wise arithmetic instructions (e.g., add, multiply (mul)) in the form of 0100xxxxb (e.g., 0x40). The parallel math group 748 performs the arithmetic operations in parallel across data channels. The vector math group 750 includes arithmetic instructions (e.g., dp4) in the form of 0101xxxxb (e.g., 0x50). The vector math group performs arithmetic such as dot product calculations on vector operands.

Graphics Pipeline

Figure 8:
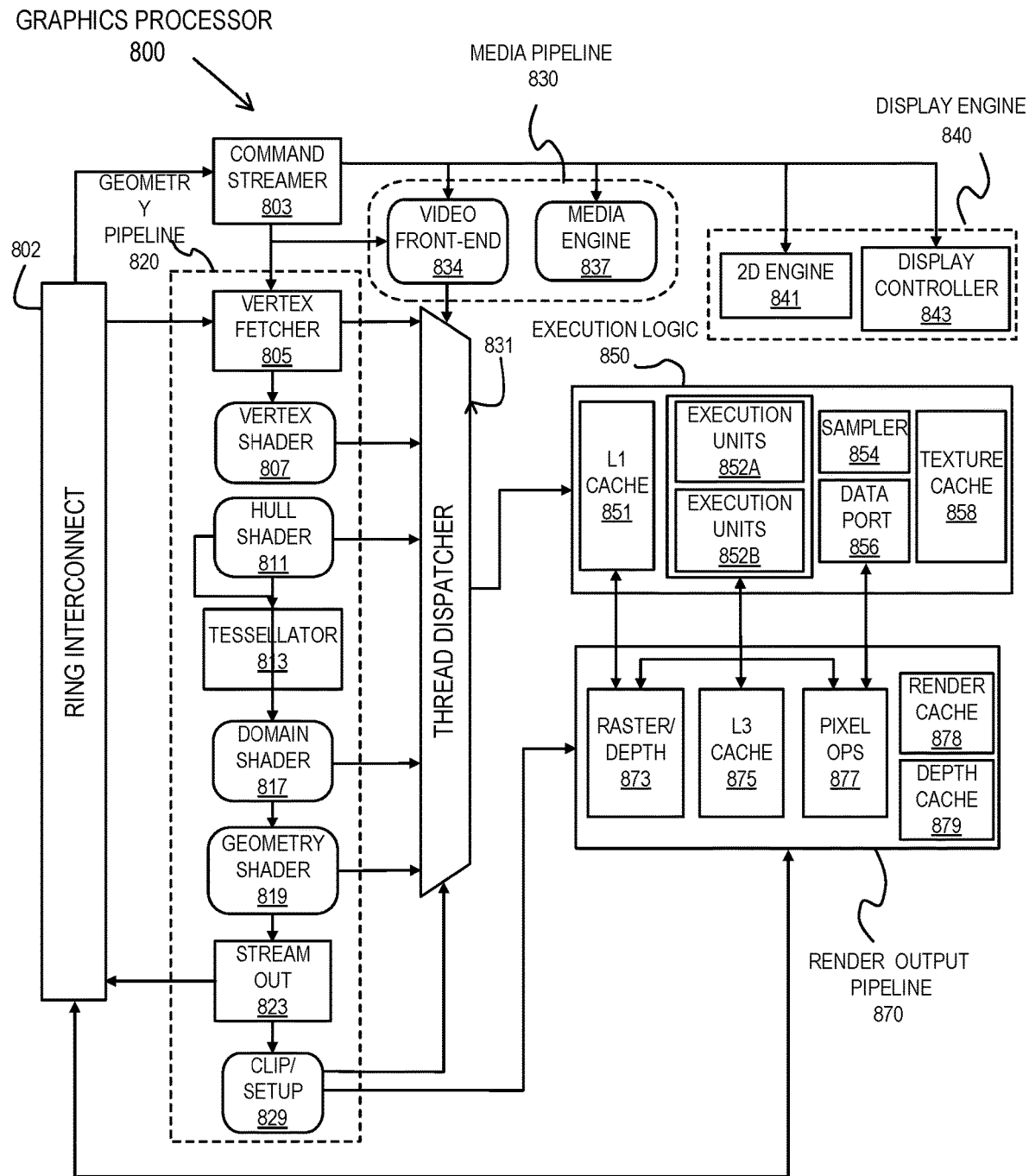
FIG. 8 is a block diagram of another embodiment of a graphics processor.

FIG. 8 is a block diagram of another embodiment of a graphics processor 800. Elements of FIG. 8 having the same reference numbers (or names) as the elements of any other figure herein can operate or function in any manner similar to that described elsewhere herein, but are not limited to such.

In some embodiments, graphics processor 800 includes a geometry pipeline 820, a media pipeline 830, a display engine 840, thread execution logic 850, and a render output pipeline 870. In some embodiments, graphics processor 800 is a graphics processor within a multi-core processing system that includes one or more general-purpose processing cores. The graphics processor is controlled by register writes to one or more control registers (not shown) or via commands issued to graphics processor 800 via a ring interconnect 802. In some embodiments, ring interconnect 802 couples graphics processor 800 to other processing components, such as other graphics processors or general-purpose processors. Commands from ring interconnect 802 are interpreted by a command streamer 803, which supplies instructions to individual components of the geometry pipeline 820 or the media pipeline 830.

In some embodiments, command streamer 803 directs the operation of a vertex fetcher 805 that reads vertex data from memory and executes vertex-processing commands provided by command streamer 803. In some embodiments, vertex fetcher 805 provides vertex data to a vertex shader 807, which performs coordinate space transformation and lighting operations to each vertex. In some embodiments, vertex fetcher 805 and vertex shader 807 execute vertex-processing instructions by dispatching execution threads to execution units 852A-852B via a thread dispatcher 831.

In some embodiments, execution units 852A-852B are an array of vector processors having an instruction set for performing graphics and media operations. In some embodiments, execution units 852A-852B have an attached L1 cache 851 that is specific for each array or shared between the arrays. The cache can be configured as a data cache, an instruction cache, or a single cache that is partitioned to contain data and instructions in different partitions.

In some embodiments, geometry pipeline 820 includes tessellation components to perform hardware-accelerated tessellation of 3D objects. In some embodiments, a programmable hull shader 811 configures the tessellation operations. A programmable domain shader 817 provides back-end evaluation of tessellation output. A tessellator 813 operates at the direction of hull shader 811 and contains special purpose logic to generate a set of detailed geometric objects based on a coarse geometric model that is provided as input to geometry pipeline 820. In some embodiments, if tessellation is not used, tessellation components (e.g., hull shader 811, tessellator 813, and domain shader 817) can be bypassed.

In some embodiments, complete geometric objects can be processed by a geometry shader 819 via one or more threads dispatched to execution units 852A-852B, or can proceed directly to the clipper 829. In some embodiments, the geometry shader operates on entire geometric objects, rather than vertices or patches of vertices as in previous stages of the graphics pipeline. If the tessellation is disabled the geometry shader 819 receives input from the vertex shader 807. In some embodiments, geometry shader 819 is programmable by a geometry shader program to perform geometry tessellation if the tessellation units are disabled.

Before rasterization, a clipper 829 processes vertex data. The clipper 829 may be a fixed function clipper or a programmable clipper having clipping and geometry shader functions. In some embodiments, a rasterizer and depth test component 873 in the render output pipeline 870 dispatches pixel shaders to convert the geometric objects into per pixel representations. In some embodiments, pixel shader logic is included in thread execution logic 850. In some embodiments, an application can bypass the rasterizer and depth test component 873 and access un-rasterized vertex data via a stream out unit 823.

The graphics processor 800 has an interconnect bus, interconnect fabric, or some other interconnect mechanism that allows data and message passing amongst the major components of the processor. In some embodiments, execution units 852A-852B and associated logic units (e.g., L1 cache 851, sampler 854, texture cache 858, etc.) interconnect via a data port 856 to perform memory access and communicate with render output pipeline components of the processor. In some embodiments, sampler 854, caches 851, 858 and execution units 852A-852B each have separate memory access paths. In one embodiment the texture cache 858 can also be configured as a sampler cache.

In some embodiments, render output pipeline 870 contains a rasterizer and depth test component 873 that converts vertex-based objects into an associated pixel-based representation. In some embodiments, the rasterizer logic includes a windower/masker unit to perform fixed function triangle and line rasterization. An associated render cache 878 and depth cache 879 are also available in some embodiments. A pixel operations component 877 performs pixel-based operations on the data, though in some instances, pixel operations associated with 2D operations (e.g. bit block image transfers with blending) are performed by the 2D engine 841, or substituted at display time by the display controller 843 using overlay display planes. In some embodiments, a shared L3 cache 875 is available to all graphics components, allowing the sharing of data without the use of main system memory.

In some embodiments, graphics processor media pipeline 830 includes a media engine 837 and a video front-end 834. In some embodiments, video front-end 834 receives pipeline commands from the command streamer 803. In some embodiments, media pipeline 830 includes a separate command streamer. In some embodiments, video front-end 834 processes media commands before sending the command to the media engine 837. In some embodiments, media engine 837 includes thread spawning functionality to spawn threads for dispatch to thread execution logic 850 via thread dispatcher 831.

In some embodiments, graphics processor 800 includes a display engine 840. In some embodiments, display engine 840 is external to processor 800 and couples with the graphics processor via the ring interconnect 802, or some other interconnect bus or fabric. In some embodiments, display engine 840 includes a 2D engine 841 and a display controller 843. In some embodiments, display engine 840 contains special purpose logic capable of operating independently of the 3D pipeline. In some embodiments, display controller 843 couples with a display device (not shown), which may be a system integrated display device, as in a laptop computer, or an external display device attached via a display device connector.

In some embodiments, the geometry pipeline 820 and media pipeline 830 are configurable to perform operations based on multiple graphics and media programming interfaces and are not specific to any one application programming interface (API). In some embodiments, driver software for the graphics processor translates API calls that are specific to a particular graphics or media library into commands that can be processed by the graphics processor. In some embodiments, support is provided for the Open Graphics Library (OpenGL), Open Computing Language (OpenCL), and/or Vulkan graphics and compute API, all from the Khronos Group. In some embodiments, support may also be provided for the Direct3D library from the Microsoft Corporation. In some embodiments, a combination of these libraries may be supported. Support may also be provided for the Open Source Computer Vision Library (OpenCV). A future API with a compatible 3D pipeline would also be supported if a mapping can be made from the pipeline of the future API to the pipeline of the graphics processor.

Graphics Pipeline Programming

Figure 9A:
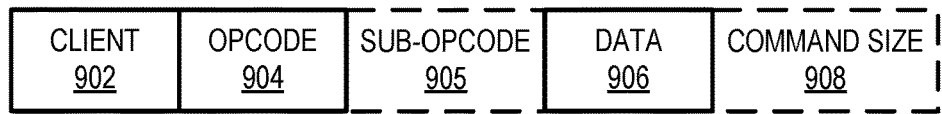
FIGS. 9A and 9B illustrate graphics processor command format and sequence, respectively, according to some embodiments.
Figure 9B:
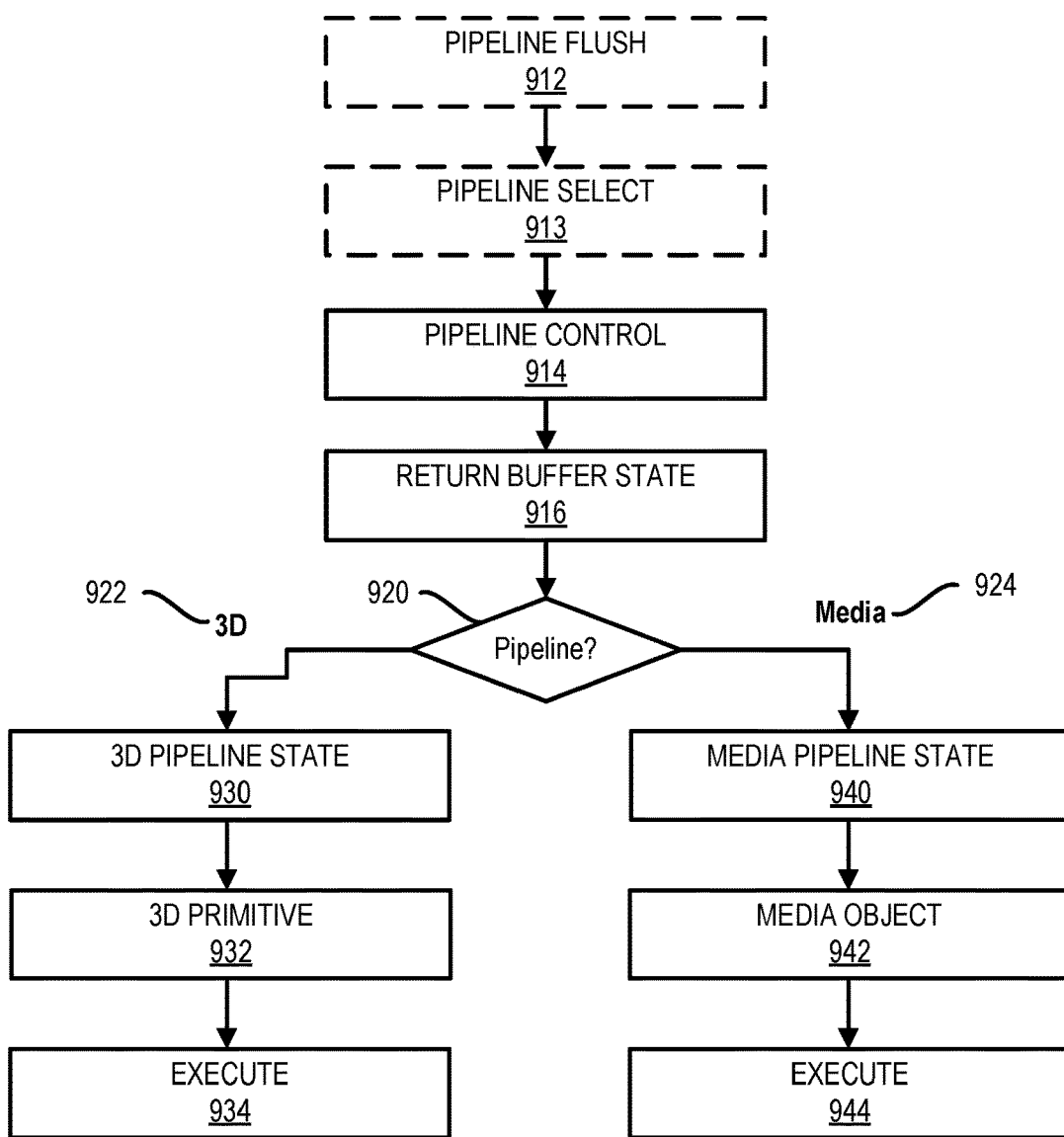

FIG. 9A is a block diagram illustrating a graphics processor command format 900 according to some embodiments. FIG. 9B is a block diagram illustrating a graphics processor command sequence 910 according to an embodiment. The solid lined boxes in FIG. 9A illustrate the components that are generally included in a graphics command while the dashed lines include components that are optional or that are only included in a sub-set of the graphics commands. The exemplary graphics processor command format 900 of FIG. 9A includes data fields to identify a client 902, a command operation code (opcode) 904, and data 906 for the command. A sub-opcode 905 and a command size 908 are also included in some commands.

In some embodiments, client 902 specifies the client unit of the graphics device that processes the command data. In some embodiments, a graphics processor command parser examines the client field of each command to condition the further processing of the command and route the command data to the appropriate client unit. In some embodiments, the graphics processor client units include a memory interface unit, a render unit, a 2D unit, a 3D unit, and a media unit. Each client unit has a corresponding processing pipeline that processes the commands. Once the command is received by the client unit, the client unit reads the opcode 904 and, if present, sub-opcode 905 to determine the operation to perform. The client unit performs the command using information in data field 906. For some commands an explicit command size 908 is expected to specify the size of the command. In some embodiments, the command parser automatically determines the size of at least some of the commands based on the command opcode. In some embodiments commands are aligned via multiples of a double word.

The flow diagram in FIG. 9B illustrates an exemplary graphics processor command sequence 910. In some embodiments, software or firmware of a data processing system that features an embodiment of a graphics processor uses a version of the command sequence shown to set up, execute, and terminate a set of graphics operations. A sample command sequence is shown and described for purposes of example only as embodiments are not limited to these specific commands or to this command sequence. Moreover, the commands may be issued as batch of commands in a command sequence, such that the graphics processor will process the sequence of commands in at least partially concurrence.

In some embodiments, the graphics processor command sequence 910 may begin with a pipeline flush command 912 to cause any active graphics pipeline to complete the currently pending commands for the pipeline. In some embodiments, the 3D pipeline 922 and the media pipeline 924 do not operate concurrently. The pipeline flush is performed to cause the active graphics pipeline to complete any pending commands. In response to a pipeline flush, the command parser for the graphics processor will pause command processing until the active drawing engines complete pending operations and the relevant read caches are invalidated. Optionally, any data in the render cache that is marked 'dirty' can be flushed to memory. In some embodiments, pipeline flush command 912 can be used for pipeline synchronization or before placing the graphics processor into a low power state.

In some embodiments, a pipeline select command 913 is used when a command sequence requires the graphics processor to explicitly switch between pipelines. In some embodiments, a pipeline select command 913 is required only once within an execution context before issuing pipeline commands unless the context is to issue commands for both pipelines. In some embodiments, a pipeline flush command 912 is required immediately before a pipeline switch via the pipeline select command 913.

In some embodiments, a pipeline control command 914 configures a graphics pipeline for operation and is used to program the 3D pipeline 922 and the media pipeline 924. In some embodiments, pipeline control command 914 configures the pipeline state for the active pipeline. In one embodiment, the pipeline control command 914 is used for pipeline synchronization and to clear data from one or more cache memories within the active pipeline before processing a batch of commands.

In some embodiments, return buffer state commands 916 are used to configure a set of return buffers for the respective pipelines to write data. Some pipeline operations require the allocation, selection, or configuration of one or more return buffers into which the operations write intermediate data during processing. In some embodiments, the graphics processor also uses one or more return buffers to store output data and to perform cross thread communication. In some embodiments, the return buffer state 916 includes selecting the size and number of return buffers to use for a set of pipeline operations.

The remaining commands in the command sequence differ based on the active pipeline for operations. Based on a pipeline determination 920, the command sequence is tailored to the 3D pipeline 922 beginning with the 3D pipeline state 930 or the media pipeline 924 beginning at the media pipeline state 940.

The commands to configure the 3D pipeline state 930 include 3D state setting commands for vertex buffer state, vertex element state, constant color state, depth buffer state, and other state variables that are to be configured before 3D primitive commands are processed. The values of these commands are determined at least in part based on the particular 3D API in use. In some embodiments, 3D pipeline state 930 commands are also able to selectively disable or bypass certain pipeline elements if those elements will not be used.

In some embodiments, 3D primitive 932 command is used to submit 3D primitives to be processed by the 3D pipeline. Commands and associated parameters that are passed to the graphics processor via the 3D primitive 932 command are forwarded to the vertex fetch function in the graphics pipeline. The vertex fetch function uses the 3D primitive 932 command data to generate vertex data structures. The vertex data structures are stored in one or more return buffers. In some embodiments, 3D primitive 932 command is used to perform vertex operations on 3D primitives via vertex shaders. To process vertex shaders, 3D pipeline 922 dispatches shader execution threads to graphics processor execution units.

In some embodiments, 3D pipeline 922 is triggered via an execute 934 command or event. In some embodiments, a register write triggers command execution. In some embodiments execution is triggered via a 'go' or 'kick' command in the command sequence. In one embodiment, command execution is triggered using a pipeline synchronization command to flush the command sequence through the graphics pipeline. The 3D pipeline will perform geometry processing for the 3D primitives. Once operations are complete, the resulting geometric objects are rasterized and the pixel engine colors the resulting pixels. Additional commands to control pixel shading and pixel back end operations may also be included for those operations.

In some embodiments, the graphics processor command sequence 910 follows the media pipeline 924 path when performing media operations. In general, the specific use and manner of programming for the media pipeline 924 depends on the media or compute operations to be performed. Specific media decode operations may be offloaded to the media pipeline during media decode. In some embodiments, the media pipeline can also be bypassed and media decode can be performed in whole or in part using resources provided by one or more general-purpose processing cores. In one embodiment, the media pipeline also includes elements for general-purpose graphics processor unit (GPGPU) operations, where the graphics processor is used to perform SIMD vector operations using computational shader programs that are not explicitly related to the rendering of graphics primitives.

In some embodiments, media pipeline 924 is configured in a similar manner as the 3D pipeline 922. A set of commands to configure the media pipeline state 940 are dispatched or placed into a command queue before the media object commands 942. In some embodiments, commands for the media pipeline state 940 include data to configure the media pipeline elements that will be used to process the media objects. This includes data to configure the video decode and video encode logic within the media pipeline, such as encode or decode format. In some embodiments, commands for the media pipeline state 940 also support the use of one or more pointers to "indirect" state elements that contain a batch of state settings.

In some embodiments, media object commands 942 supply pointers to media objects for processing by the media pipeline. The media objects include memory buffers containing video data to be processed. In some embodiments, all media pipeline states must be valid before issuing a media object command 942. Once the pipeline state is configured and media object commands 942 are queued, the media pipeline 924 is triggered via an execute command 944 or an equivalent execute event (e.g., register write). Output from media pipeline 924 may then be post processed by operations provided by the 3D pipeline 922 or the media pipeline 924. In some embodiments, GPGPU operations are configured and executed in a similar manner as media operations.

Graphics Software Architecture

Figure 10:
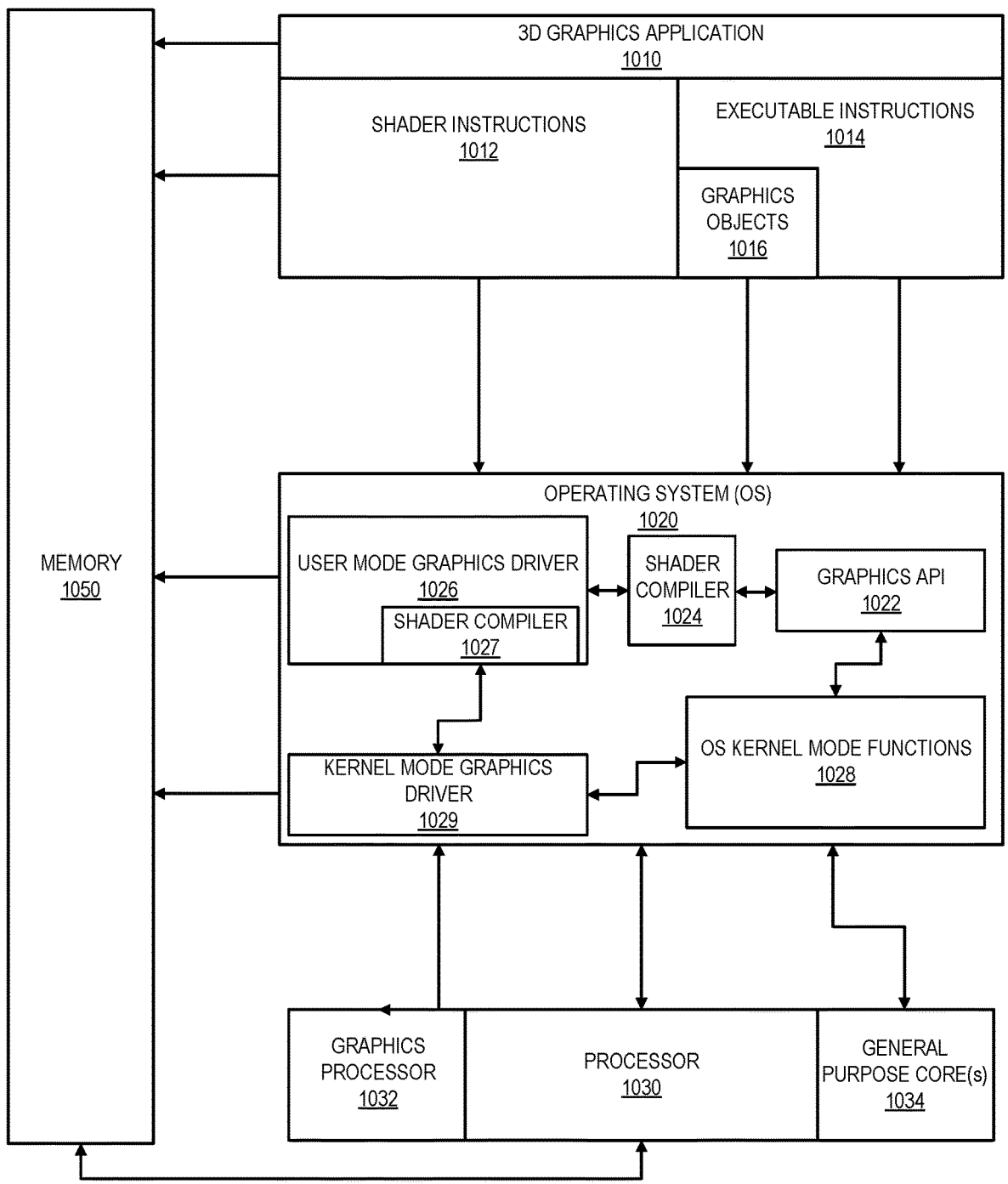
FIG. 10 illustrates exemplary graphics software architecture for a data processing system according to some embodiments.

FIG. 10 illustrates exemplary graphics software architecture for a data processing system 1000 according to some embodiments. In some embodiments, software architecture includes a 3D graphics application 1010, an operating system 1020, and at least one processor 1030. In some embodiments, processor 1030 includes a graphics processor 1032 and one or more general-purpose processor core(s) 1034. The graphics application 1010 and operating system 1020 each execute in the system memory 1050 of the data processing system.

In some embodiments, 3D graphics application 1010 contains one or more shader programs including shader instructions 1012. The shader language instructions may be in a high-level shader language, such as the High Level Shader Language (HLSL) or the OpenGL Shader Language (GLSL). The application also includes executable instructions 1014 in a machine language suitable for execution by the general-purpose processor core 1034. The application also includes graphics objects 1016 defined by vertex data.

In some embodiments, operating system 1020 is a Microsoft® Windows® operating system from the Microsoft Corporation, a proprietary UNIX-like operating system, or an open source UNIX-like operating system using a variant of the Linux kernel. The operating system 1020 can support a graphics API 1022 such as the Direct3D API, the OpenGL API, or the Vulkan API. When the Direct3D API is in use, the operating system 1020 uses a front-end shader compiler 1024 to compile any shader instructions 1012 in HLSL into a lower-level shader language. The compilation may be a just-in-time (JIT) compilation or the application can perform shader pre-compilation. In some embodiments, high-level shaders are compiled into low-level shaders during the compilation of the 3D graphics application 1010. In some embodiments, the shader instructions 1012 are provided in an intermediate form, such as a version of the Standard Portable Intermediate Representation (SPIR) used by the Vulkan API.

In some embodiments, user mode graphics driver 1026 contains a back-end shader compiler 1027 to convert the shader instructions 1012 into a hardware specific representation. When the OpenGL API is in use, shader instructions 1012 in the GLSL high-level language are passed to a user mode graphics driver 1026 for compilation. In some embodiments, user mode graphics driver 1026 uses operating system kernel mode functions 1028 to communicate with a kernel mode graphics driver 1029. In some embodiments, kernel mode graphics driver 1029 communicates with graphics processor 1032 to dispatch commands and instructions.

IP Core Implementations

One or more aspects of at least one embodiment may be implemented by representative code stored on a machine-readable medium which represents and/or defines logic within an integrated circuit such as a processor. For example, the machine-readable medium may include instructions which represent various logic within the processor. When read by a machine, the instructions may cause the machine to fabricate the logic to perform the techniques described herein. Such representations, known as "IP cores," are reusable units of logic for an integrated circuit that may be stored on a tangible, machine-readable medium as a hardware model that describes the structure of the integrated circuit. The hardware model may be supplied to various customers or manufacturing facilities, which load the hardware model on fabrication machines that manufacture the integrated circuit. The integrated circuit may be fabricated such that the circuit performs operations described in association with any of the embodiments described herein.

Figure 11A:
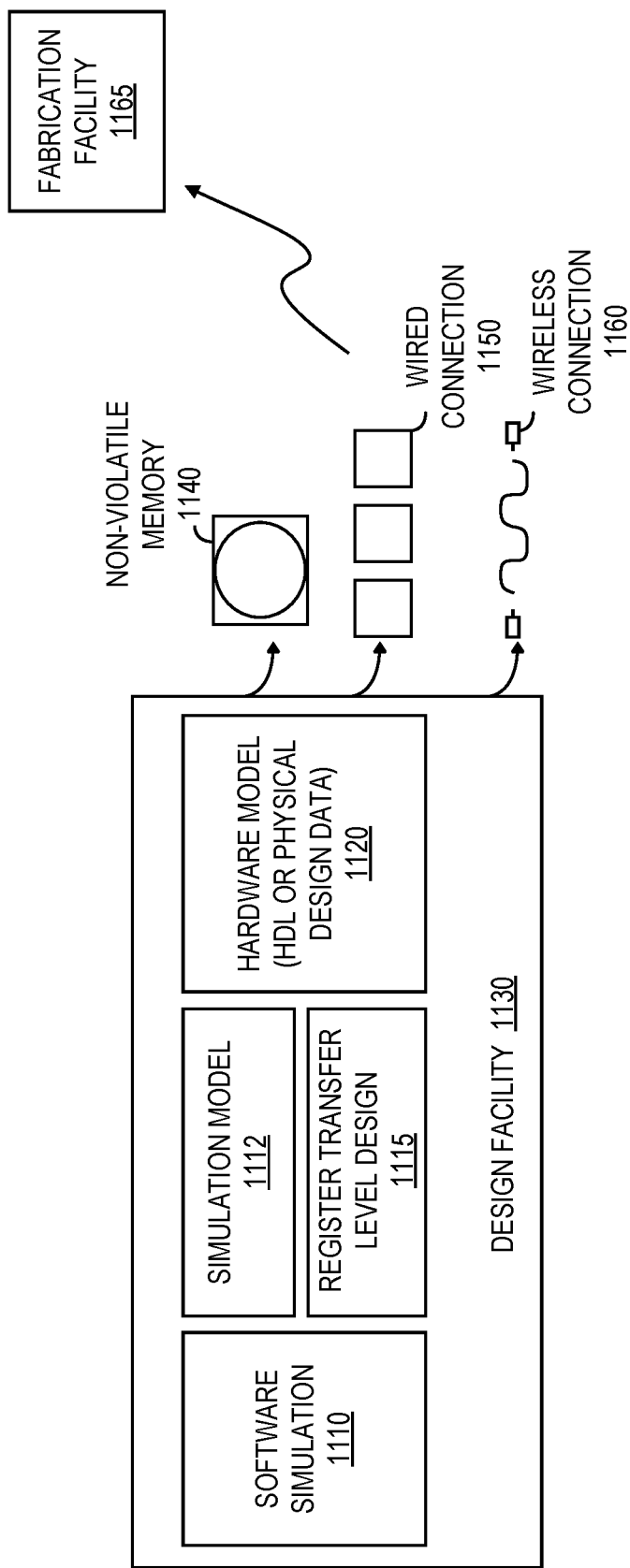
FIG. 11A illustrates a diagram of IP core development according to an embodiment.

FIG. 11A is a block diagram illustrating an IP core development system 1100 that may be used to manufacture an integrated circuit to perform operations according to an embodiment. The IP core development system 1100 may be used to generate modular, re-usable designs that can be incorporated into a larger design or used to construct an entire integrated circuit (e.g., an SOC integrated circuit). A design facility 1130 can generate a software simulation 1110 of an IP core design in a high-level programming language (e.g., C/C++). The software simulation 1110 can be used to design, test, and verify the behavior of the IP core using a simulation model 1112. The simulation model 1112 may include functional, behavioral, and/or timing simulations. A register transfer level (RTL) design 1115 can then be created or synthesized from the simulation model 1112. The RTL design 1115 is an abstraction of the behavior of the integrated circuit that models the flow of digital signals between hardware registers, including the associated logic performed using the modeled digital signals. In addition to an RTL design 1115, lower-level designs at the logic level or transistor level may also be created, designed, or synthesized. Thus, the particular details of the initial design and simulation may vary.

The RTL design 1115 or equivalent may be further synthesized by the design facility into a hardware model 1120, which may be in a hardware description language (HDL), or some other representation of physical design data. The HDL may be further simulated or tested to verify the IP core design. The IP core design can be stored for delivery to a $3^{rd}$ party fabrication facility 1165 using non-volatile memory 1140 (e.g., hard disk, flash memory, or any non-volatile storage medium). Alternatively, the IP core design may be transmitted (e.g., via the Internet) over a wired connection 1150 or wireless connection 1160. The fabrication facility 1165 may then fabricate an integrated circuit that is based at least in part on the IP core design. The fabricated integrated circuit can be configured to perform operations in accordance with at least one embodiment described herein.

Figure 11B:
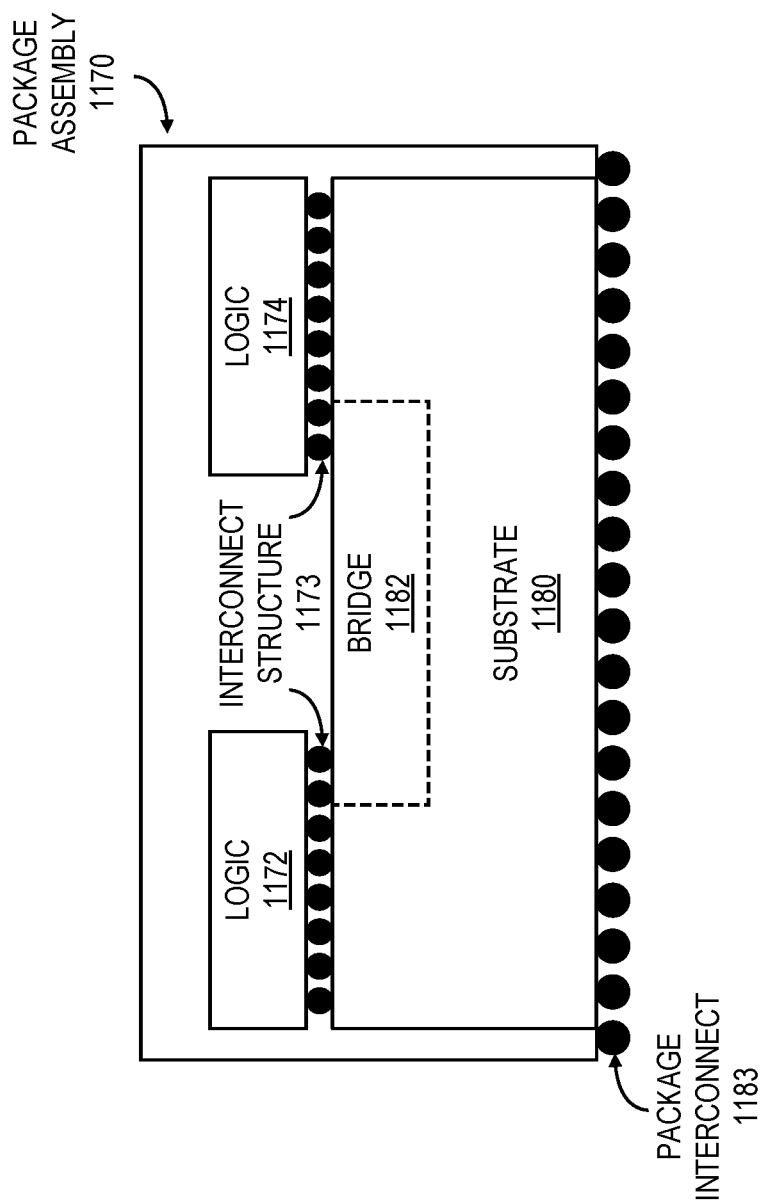
FIG. 11B illustrates a cross-section side view of an integrated circuit package assembly, according to some embodiments described herein.

FIG. 11B illustrates a cross-section side view of an integrated circuit package assembly 1170, according to some embodiments described herein. The integrated circuit package assembly 1170 illustrates an implementation of one or more processor or accelerator devices as described herein. The package assembly 1170 includes multiple units of hardware logic 1172, 1174 connected to a substrate 1180. The logic 1172, 1174 may be implemented at least partly in configurable logic or fixed-functionality logic hardware, and can include one or more portions of any of the processor core(s), graphics processor(s), or other accelerator devices described herein. Each unit of logic 1172, 1174 can be implemented within a semiconductor die and coupled with the substrate 1180 via an interconnect structure 1173. The interconnect structure 1173 may be configured to route electrical signals between the logic 1172, 1174 and the substrate 1180, and can include interconnects such as, but not limited to bumps or pillars. In some embodiments, the interconnect structure 1173 may be configured to route electrical signals such as, for example, input/output (I/O) signals and/or power or ground signals associated with the operation of the logic 1172, 1174. In some embodiments, the substrate 1180 is an epoxy-based laminate substrate. The package substrate 1180 may include other suitable types of substrates in other embodiments. The package assembly 1170 can be connected to other electrical devices via a package interconnect 1183. The package interconnect 1183 may be coupled to a surface of the substrate 1180 to route electrical signals to other electrical devices, such as a motherboard, other chipset, or multi-chip module.

In some embodiments, the units of logic 1172, 1174 are electrically coupled with a bridge 1182 that is configured to route electrical signals between the logic 1172, 1174. The bridge 1182 may be a dense interconnect structure that provides a route for electrical signals. The bridge 1182 may include a bridge substrate composed of glass or a suitable semiconductor material. Electrical routing features can be formed on the bridge substrate to provide a chip-to-chip connection between the logic 1172, 1174.

Although two units of logic 1172, 1174 and a bridge 1182 are illustrated, embodiments described herein may include more or fewer logic units on one or more dies. The one or more dies may be connected by zero or more bridges, as the bridge 1182 may be excluded when the logic is included on a single die. Alternatively, multiple dies or units of logic can be connected by one or more bridges. Additionally, multiple logic units, dies, and bridges can be connected together in other possible configurations, including three-dimensional configurations.

Exemplary System on a Chip Integrated Circuit

Figure 12:
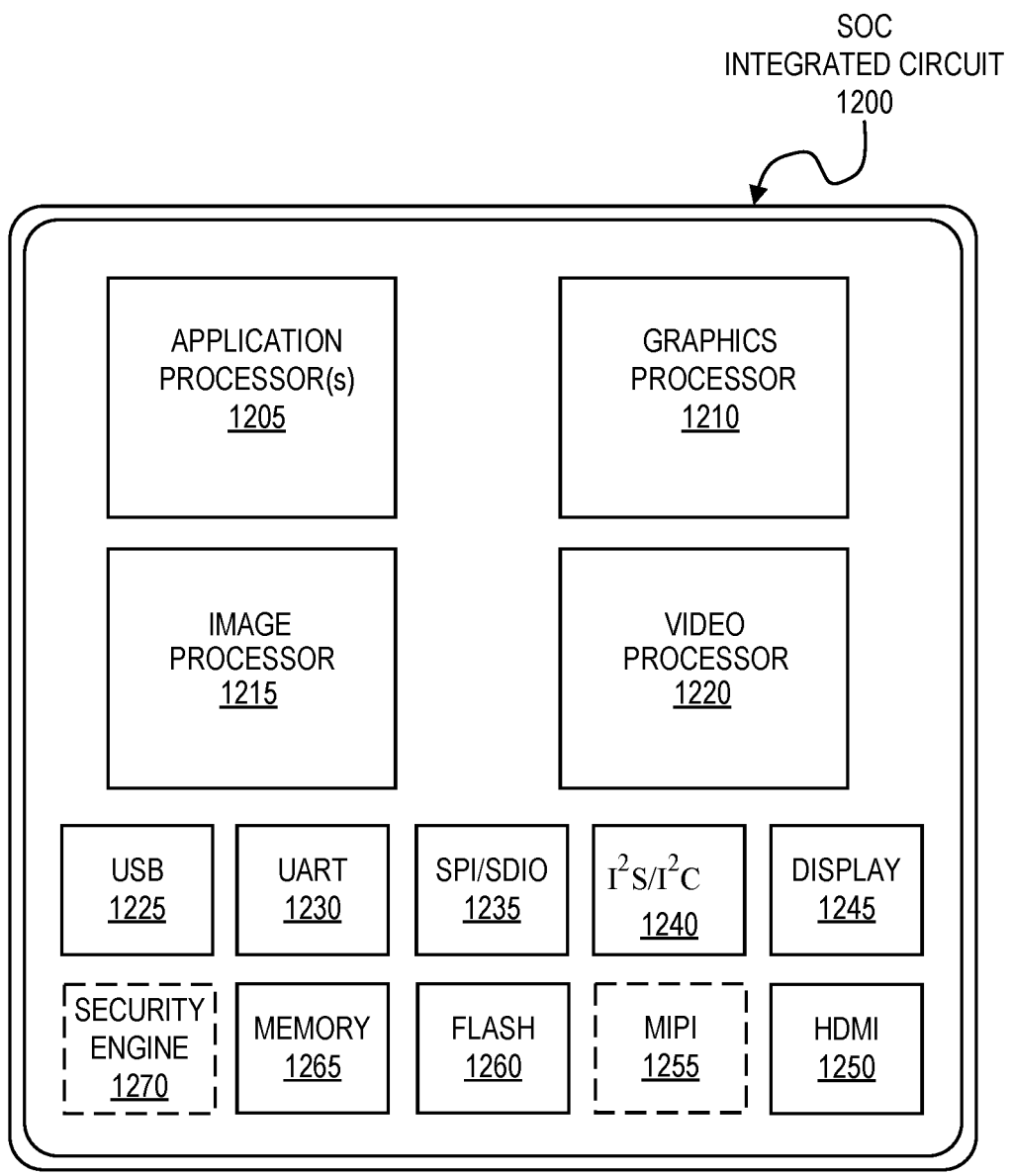
FIG. 12 illustrated exemplary integrated circuits and associated graphics processors that may be fabricated using one or more IP cores, according to various embodiments described herein.

FIGS. 12-14 illustrated exemplary integrated circuits and associated graphics processors that may be fabricated using one or more IP cores, according to various embodiments described herein. In addition to what is illustrated, other logic and circuits may be included, including additional graphics processors/cores, peripheral interface controllers, or general-purpose processor cores.

FIG. 12 is a block diagram illustrating an exemplary system on a chip integrated circuit 1200 that may be fabricated using one or more IP cores, according to an embodiment. Exemplary integrated circuit 1200 includes one or more application processor(s) 1205 (e.g., CPUs), at least one graphics processor 1210, and may additionally include an image processor 1215 and/or a video processor 1220, any of which may be a modular IP core from the same or multiple different design facilities. Integrated circuit 1200 includes peripheral or bus logic including a USB controller 1225, UART controller 1230, an SPI/SDIO controller 1235, and an $I^2S/I^2C$ controller 1240. Additionally, the integrated circuit can include a display device 1245 coupled to one or more of a high-definition multimedia interface (HDMI)

controller 1250 and a mobile industry processor interface (MIPI) display interface 1255. Storage may be provided by a flash memory subsystem 1260 including flash memory and a flash memory controller. Memory interface may be provided via a memory controller 1265 for access to SDRAM or SRAM memory devices. Some integrated circuits additionally include an embedded security engine 1270.

Figure 13A:
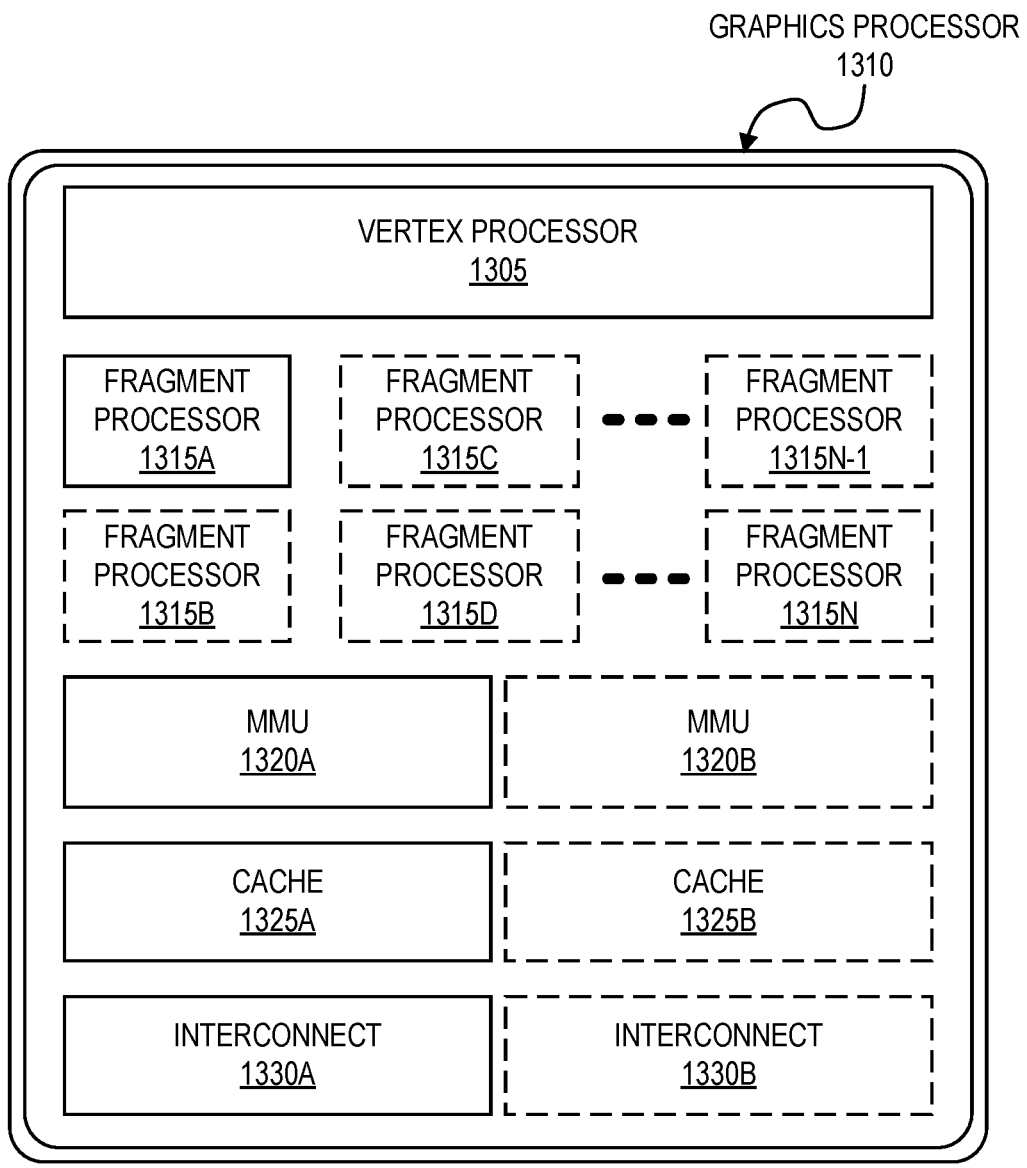
FIGS. 13A and 13B are block diagrams illustrating exemplary graphics processors for use within an SoC, according to embodiments described herein.
Figure 13B:
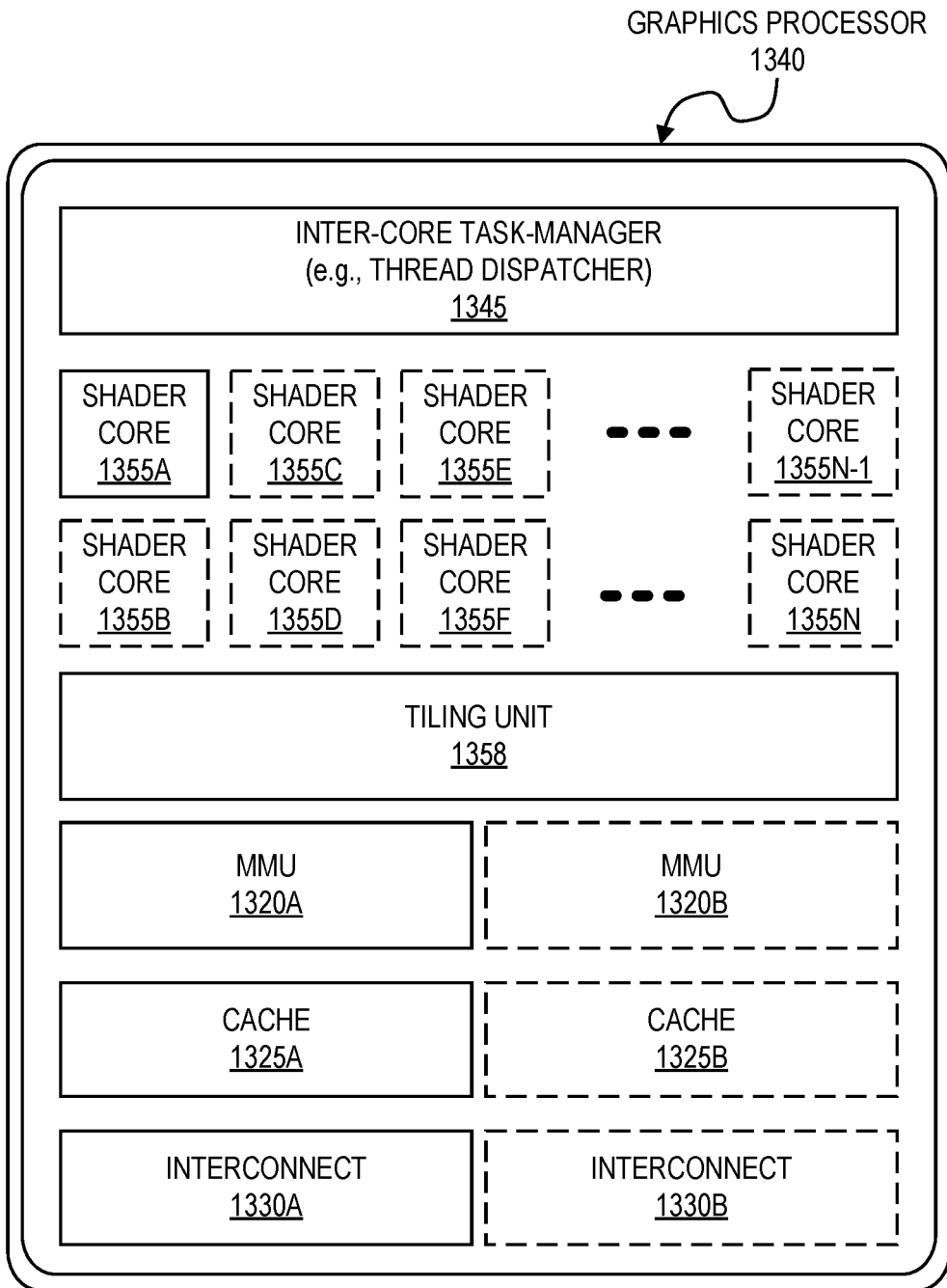

FIGS. 13A-13B are block diagrams illustrating exemplary graphics processors for use within an SoC, according to embodiments described herein. FIG. 13A illustrates an exemplary graphics processor 1310 of a system on a chip integrated circuit that may be fabricated using one or more IP cores, according to an embodiment. FIG. 13B illustrates an additional exemplary graphics processor 1340 of a system on a chip integrated circuit that may be fabricated using one or more IP cores, according to an embodiment. Graphics processor 1310 of FIG. 13A is an example of a low power graphics processor core. Graphics processor 1340 of FIG. 13B is an example of a higher performance graphics processor core. Each of the graphics processors 1310, 1340 can be variants of the graphics processor 1210 of FIG. 12.

As shown in FIG. 13A, graphics processor 1310 includes a vertex processor 1305 and one or more fragment processor(s) 1315A-1315N (e.g., 1315A, 1315B, 1315C, 1315D, through 1315N-1, and 1315N). Graphics processor 1310 can execute different shader programs via separate logic, such that the vertex processor 1305 is optimized to execute operations for vertex shader programs, while the one or more fragment processor(s) 1315A-1315N execute fragment (e.g., pixel) shading operations for fragment or pixel shader programs. The vertex processor 1305 performs the vertex processing stage of the 3D graphics pipeline and generates primitives and vertex data. The fragment processor(s) 1315A-1315N use the primitive and vertex data generated by the vertex processor 1305 to produce a framebuffer that is displayed on a display device. In one embodiment, the fragment processor(s) 1315A-1315N are optimized to execute fragment shader programs as provided for in the OpenGL API, which may be used to perform similar operations as a pixel shader program as provided for in the Direct 3D API.

Graphics processor 1310 additionally includes one or more memory management units (MMUs) 1320A-1320B, cache(s) 1325A-1325B, and circuit interconnect(s) 1330A-1330B. The one or more MMU(s) 1320A-1320B provide for virtual to physical address mapping for the graphics processor 1310, including for the vertex processor 1305 and/or fragment processor(s) 1315A-1315N, which may reference vertex or image/texture data stored in memory, in addition to vertex or image/texture data stored in the one or more cache(s) 1325A-1325B. In one embodiment the one or more MMU(s) 1320A-1320B may be synchronized with other MMUs within the system, including one or more MMUs associated with the one or more application processor(s) 1205, image processor 1215, and/or video processor 1220 of FIG. 12, such that each processor 1205-1220 can participate in a shared or unified virtual memory system. The one or more circuit interconnect(s) 1330A-1330B enable graphics processor 1310 to interface with other IP cores within the SoC, either via an internal bus of the SoC or via a direct connection, according to embodiments.

As shown FIG. 13B, graphics processor 1340 includes the one or more MMU(s) 1320A-1320B, caches 1325A-1325B, and circuit interconnects 1330A-1330B of the graphics processor 1310 of FIG. 13A. Graphics processor 1340 includes one or more shader core(s) 1355A-1355N (e.g., 1455A, 1355B, 1355C, 1355D, 1355E, 1355F, through 1355N-1, and 1355N), which provides for a unified shader core architecture in which a single core or type or core can execute all types of programmable shader code, including shader program code to implement vertex shaders, fragment shaders, and/or compute shaders. The exact number of shader cores present can vary among embodiments and implementations. Additionally, graphics processor 1340 includes an inter-core task manager 1345, which acts as a thread dispatcher to dispatch execution threads to one or more shader cores 1355A-1355N and a tiling unit 1358 to accelerate tiling operations for tile-based rendering, in which rendering operations for a scene are subdivided in image space, for example to exploit local spatial coherence within a scene or to optimize use of internal caches.

Figure 14A:
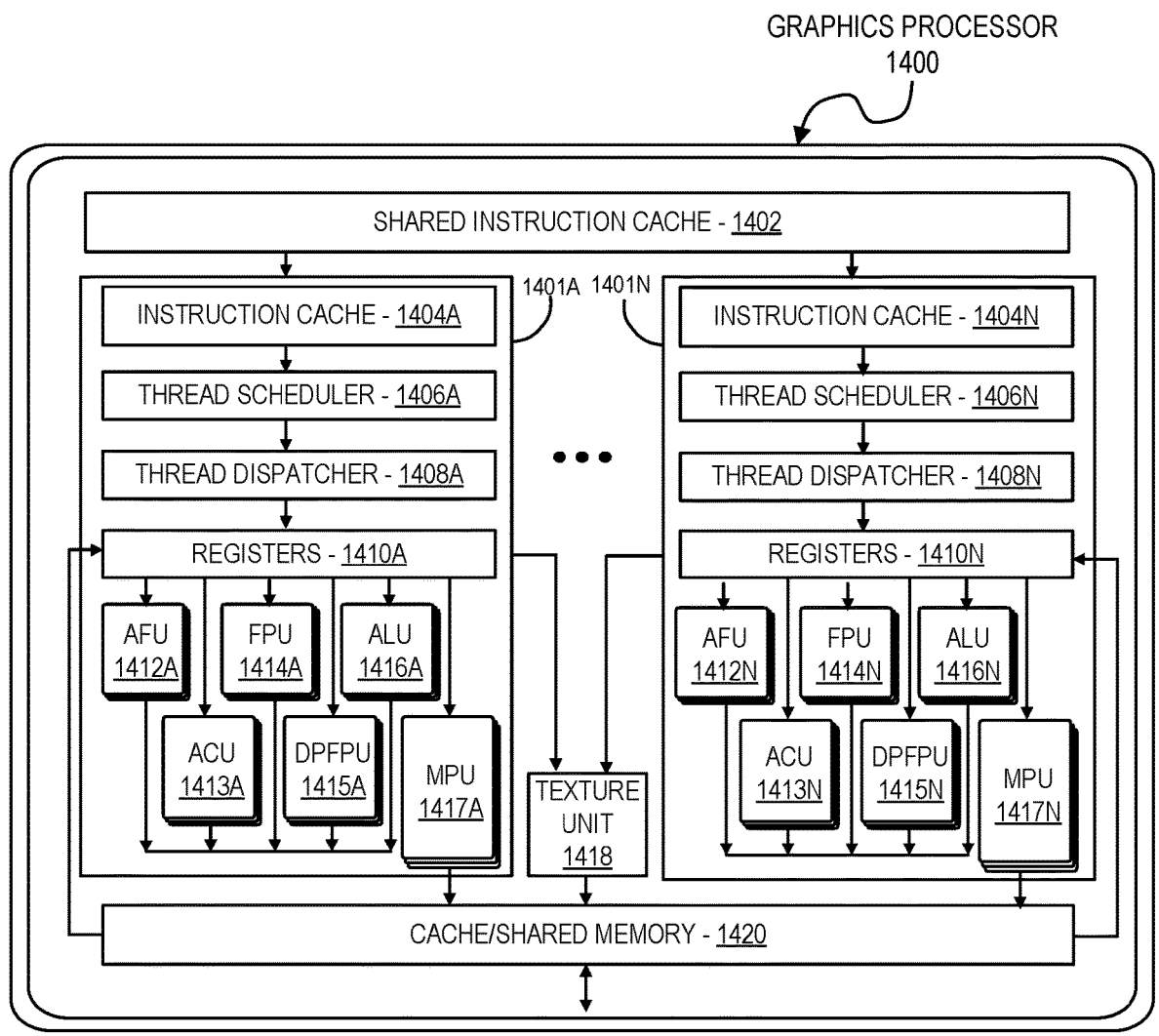
FIGS. 14A and 14B illustrate additional exemplary graphics processor logic according to embodiments described herein.
Figure 14B:
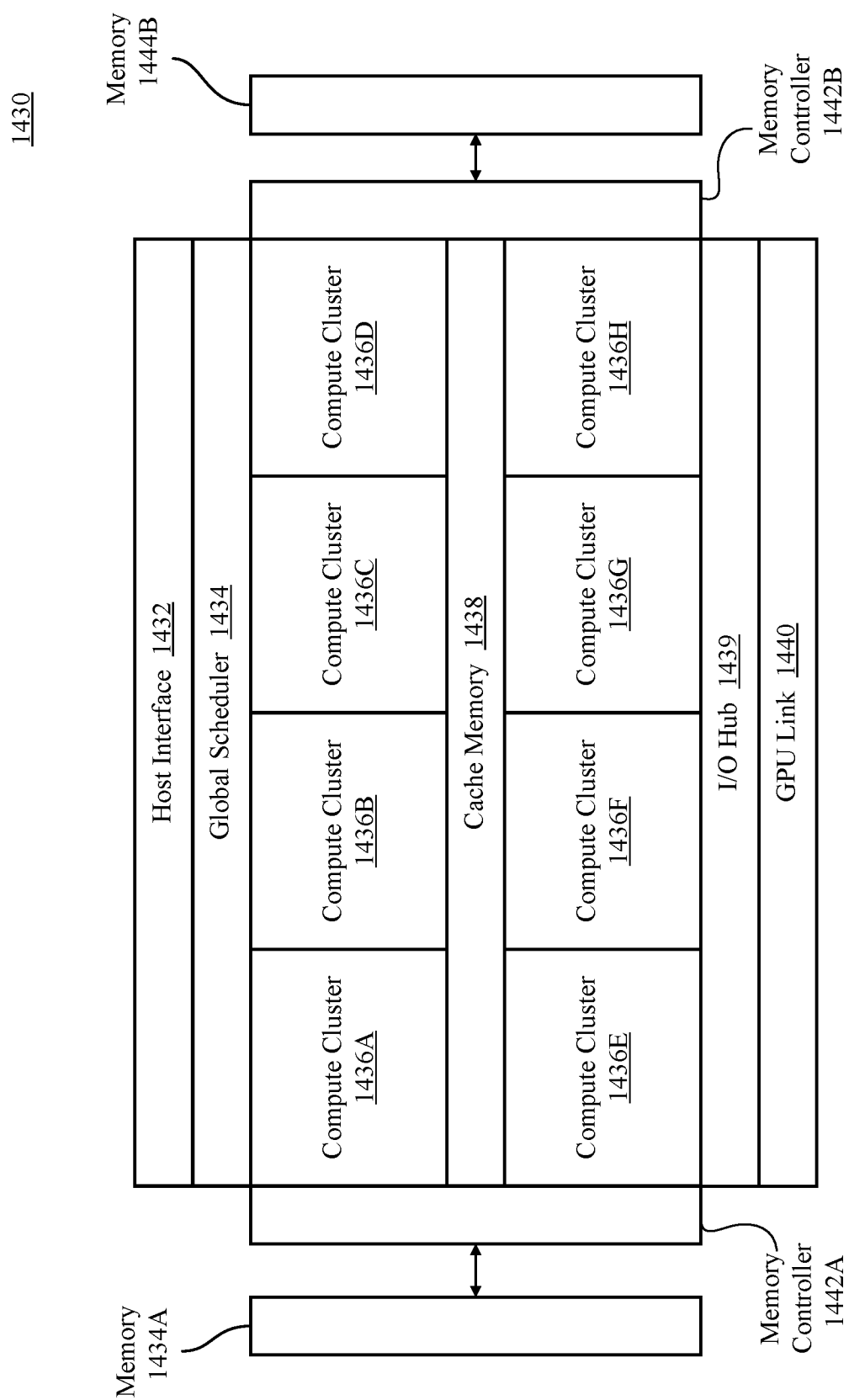

FIGS. 14A-14B illustrate additional exemplary graphics processor logic according to embodiments described herein. FIG. 14A illustrates a graphics core 1400 that may be included within the graphics processor 1210 of FIG. 12, and may be a unified shader core 1355A-1355N as in FIG. 13B. FIG. 14B illustrates a highly-parallel general-purpose graphics processing unit 1430 suitable for deployment on a multi-chip module.

As shown in FIG. 14A, the graphics core 1400 includes a shared instruction cache 1402, a texture unit 1418, and a cache/shared memory 1420 that are common to the execution resources within the graphics core 1400. The graphics core 1400 can include multiple slices 1401A-1401N or partition for each core, and a graphics processor can include multiple instances of the graphics core 1400. The slices 1401A-1401N can include support logic including a local instruction cache 1404A-1404N, a thread scheduler 1406A-1406N, a thread dispatcher 1408A-1408N, and a set of registers 1410A. To perform logic operations, the slices 1401A-1401N can include a set of additional function units (AFUs 1412A-1412N), floating-point units (FPU 1414A-1414N), integer arithmetic logic units (ALUs 1416-1416N), address computational units (ACU 1413A-1413N), double-precision floating-point units (DPFPU 1415A-1415N), and matrix processing units (MPU 1417A-1417N).

Some of the computational units operate at a specific precision. For example, the FPUs 1414A-1414N can perform single-precision (32-bit) and half-precision (16-bit) floating point operations, while the DPFPUs 1415A-1415N perform double precision (64-bit) floating point operations. The ALUs 1416A-1416N can perform variable precision integer operations at 8-bit, 16-bit, and 32-bit precision, and can be configured for mixed precision operations. The MPUs 1417A-1417N can also be configured for mixed precision matrix operations, including half-precision floating point and 8-bit integer operations. The MPUs 1417-1417N can perform a variety of matrix operations to accelerate machine learning application frameworks, including enabling support for accelerated general matrix to matrix multiplication (GEMM). The AFUs 1412A-1412N can perform additional logic operations not supported by the floating-point or integer units, including trigonometric operations (e.g., Sine, Cosine, etc.).

As shown in FIG. 14B, a general-purpose processing unit (GPGPU) 1430 can be configured to enable highly-parallel compute operations to be performed by an array of graphics processing units. Additionally, the GPGPU 1430 can be linked directly to other instances of the GPGPU to create a multi-GPU cluster to improve training speed for particularly deep neural networks. The GPGPU 1430 includes a host interface 1432 to enable a connection with a host processor. In one embodiment the host interface 1432 is a PCI Express interface. However, the host interface can also be a vendor specific communications interface or communications fabric. The GPGPU 1430 receives commands from the host processor and uses a global scheduler 1434 to distribute execution threads associated with those commands to a set of compute clusters 1436A-1436H. The compute clusters 1436A-1436H share a cache memory 1438. The cache memory 1438 can serve as a higher-level cache for cache memories within the compute clusters 1436A-1436H.

The GPGPU 1430 includes memory 1434A-1434B coupled with the compute clusters 1436A-1436H via a set of memory controllers 1442A-1442B. In various embodiments, the memory 1434A-1434B can include various types of memory devices including dynamic random access memory (DRAM) or graphics random access memory, such as synchronous graphics random access memory (SGRAM), including graphics double data rate (GDDR) memory.

In one embodiment the compute clusters 1436A-1436H each include a set of graphics cores, such as the graphics core 1400 of FIG. 14A, which can include multiple types of integer and floating point logic units that can perform computational operations at a range of precisions including suited for machine learning computations. For example and in one embodiment at least a subset of the floating point units in each of the compute clusters 1436A-1436H can be configured to perform 16-bit or 32-bit floating point operations, while a different subset of the floating point units can be configured to perform 64-bit floating point operations.

Multiple instances of the GPGPU 1430 can be configured to operate as a compute cluster. The communication mechanism used by the compute cluster for synchronization and data exchange varies across embodiments. In one embodiment the multiple instances of the GPGPU 1430 communicate over the host interface 1432. In one embodiment the GPGPU 1430 includes an I/O hub 1439 that couples the GPGPU 1430 with a GPU link 1440 that enables a direct connection to other instances of the GPGPU. In one embodiment the GPU link 1440 is coupled to a dedicated GPU-to-GPU bridge that enables communication and synchronization between multiple instances of the GPGPU 1430. In one embodiment the GPU link 1440 couples with a high speed interconnect to transmit and receive data to other GPGPUs or parallel processors. In one embodiment the multiple instances of the GPGPU 1430 are located in separate data processing systems and communicate via a network device that is accessible via the host interface 1432. In one embodiment the GPU link 1440 can be configured to enable a connection to a host processor in addition to or as an alternative to the host interface 1432.

While the illustrated configuration of the GPGPU 1430 can be configured to train neural networks, one embodiment provides alternate configuration of the GPGPU 1430 that can be configured for deployment within a high performance or low power inferencing platform. In an inferencing configuration the GPGPU 1430 includes fewer of the compute clusters 1436A-1436H relative to the training configuration. Additionally, the memory technology associated with the memory 1434A-1434B may differ between inferencing and training configurations, with higher bandwidth memory technologies devoted to training configurations. In one embodiment the inferencing configuration of the GPGPU 1430 can support inferencing specific instructions. For example, an inferencing configuration can provide support for one or more 8-bit integer dot product instructions, which are commonly used during inferencing operations for deployed neural networks.

As mentioned above, efficient power management can have a direct impact on efficiency, longevity, as well as usage models for electronic devices. For example, format conversion is expensive in terms of gate count and power consumption in algorithmic hardware units like a Graphics Processing Unit (GPU). Unorm (Unsigned normalized) integer value conversion to float (floating-point) value is the most common conversion in texture filtering units. Due to scaling frequencies, the associated power scaling problem has to be solved.

By contrast, most datapath units in the past use a shared general purpose rescale unit which deals with varying precision based on format type and Bits Per Channel (BPC). Such past implementations may pose one or more of the following issues: (1) Gate Count: the size of the general purpose rescale can be around 10-90× the gate count of specialized rescale; (2) Power: the power of general purpose rescale is around 7-15× optimized rescale; and (3) Timing Sensitivity: long precision input for leading detection, shifter and rounding (general purpose conversion cannot easily parallelize tasks).

To this end, some embodiments provide techniques for conversion of unorm values to float values in low power. In an embodiment, unorm to float conversion can be simplified by addressing three cases: all zero, all ones and the rest. For all zeros and all ones, the answer is a constant. For other cases, the leading detection, shift and round can be limited to n bits where n (e.g., 8, 16, 32, etc.) is the size of the unorm value. This allows for point sample bypass in the Floating Point unit (FL unit) of a sampler (which may have at least 40% utilization in all benchmarks) and would reduce power significantly (e.g., by 60 pF for point power state). Logic to provide the conversion of unorm values to float values may be coupled to or provided in a processor (where the processor may be a general purpose processor, a graphics processor (or Graphics Processing Unit (GPU), a General Purpose GPU (GPGPU), etc.).

One or more of the embodiments discussed herein may provide: (1) Gate count: the new rescale is far less gates (e.g., 90× smaller) than general purpose solutions; (2) Power Consumption: the new solution can decrease power significantly (e.g., from 60 pF to 4 pF); (3) Latency and Timing: the designs discussed herein are very friendly to timing and can easily fit in less than one flop stage in most high speed designs compared for 4-5 in more traditional approaches; and (4) Costs: due to lesser cost, one or more embodiments could be used in future to enhance throughput for special cases.

Figure 15:
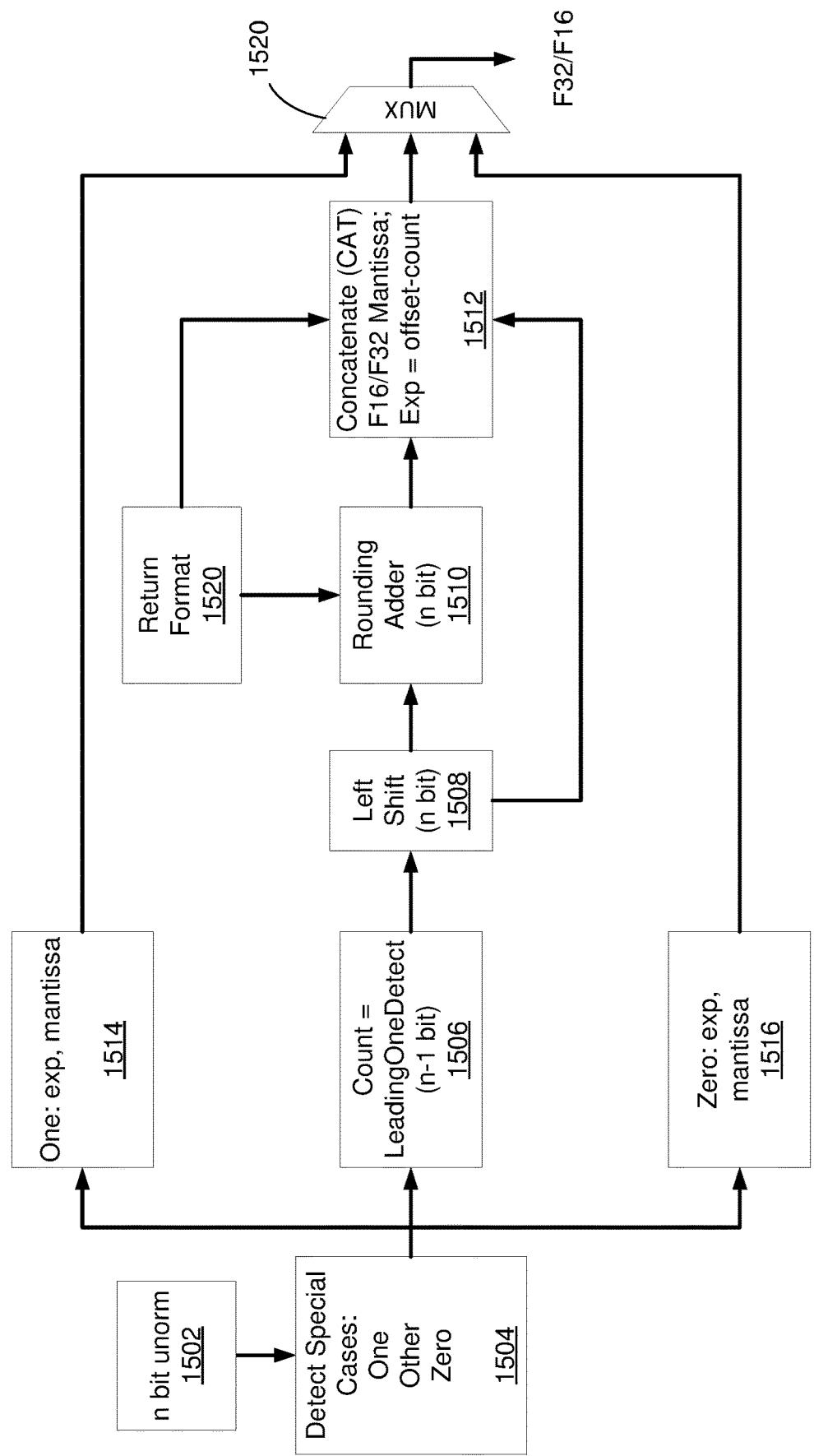
FIG. 15 illustrates a block diagram of logic to convert unorm integer values to floating-point values in low power, according to an embodiment.

FIG. 15 illustrates a block diagram of logic to convert unorm integer values to floating-point values in low power, according to an embodiment. More particularly, FIG. 15 simplifies any conversion from unorm to float. Also, while some of the sample embodiments discussed herein may discuss an implementation for 8-bit unorm values (which are the most commonly used format in textures currently), embodiments are not limited to 8-bit unorm values and other bit values may be used (such as 16 bit, 32 bit, 64 bit, 128 bit, 256 bit, 512 bit, 1024 bit, and so on). In one or more embodiments, the illustrated logic is provided inside a GPU or graphics logic, or otherwise communicatively coupled to a GPU or graphics logic.

Normally, to convert into fixed point, a division by $(2^{\wedge}n-1)$ may be performed, which is the same as multiplying by $\{(n-1 \ 0s), 1\}$. The multiplication is the same as replicating the n-bit unorm number up to the precision supported. The precision supported could be high based on the maximum precision supported for various filtering operations. Hence, one traditional rescale pipeline may in order: replicate (n→71), detect the leading one (71b), left shift (71b), perform RTNE (Round To Nearest Even) based on DRF (or Data Return Format (such as 16 vs. 32 float)), and determine whether to perform floating point 32-bit (F32) to floating point 16-bit (F16) based on the returned format. While some embodiments discuss 71b of precision, this is merely an example of utilizing a lot of precision, e.g., during a rare filtering case, for illustration purposes. In most implementations, the level of precision would be less (e.g., around 24 bits (or the number of mantissa bits for a 32 bit floating point value), and mostly without no filtering on point sampling.

Referring to FIG. 15, assume n is the size of input unorm data 1502. FIG. 15 illustrates logic to implement 8-bit unorm conversion (most commonly used for textures currently). At 1504, the special cases for the received unorm of 1502 is detected. An embodiment considers the following three cases for unorm data:

Case 1 at 1516: all zeros: Float output is a constant;
Case 2 at 1514: all ones: Float output is a constant; and
Case 3 at 1506: other cases: where at least a one and a zero are present, the output float can be calculated as below.

With respect to case 3 at 1506, since there is a zero in the data, rounding will be limited to n bits as a carry will not propagate. This can help move rounding before replication/concatenation. First, a leading one detector 1506 is used and the n−1 result (after the detected one) is stored as a count value. Then, at 1508, the data is shifted left up to n bits based on the count value of 1506. The shifted data may be replicated to form the final mantissa. To round the mantissa at 1510, the Least Significant Bit (LSB) n bit position is extracted from the mantissa and a constant one (since there is a one in −1 to −infinity position) is added. Multiplexer 1520 can then output the resulting F32 or F16 values per each case. For example, in case 1 (all zeros) or case 2 (all ones), a constant exponent and mantissa is output at the multiplexer (per 1516 and 1514, respectively). In case 3 (combination of one and zero), a concatenated version of mantissa and exponent at 1512 (where the exponent value is determined based on a difference between the count and an offset value) is output at the multiplexer. As discussed herein, the "offset" value generally refers to the "excess" that is used when storing exponents in standard floating point and is added to make all exponents positive. On IEEE formats it is 2^(size(exponent))−1). For example, on float 32 with an 8 bit exponent, the offset is 127. So an exponent of "3" is stored as a 130. Also, return format 1520 generally refers to a mode to indicate whether the return is float16 or float32 (e.g., mainly this may just affect the number of mantissa bits and the offset for the exponent).

FIG. 16 shows a sample pseudo code to implement an 8-bit unorm conversion, according to an embodiment. In an embodiment, the pseudo code of FIG. 16 implements the operations discussed with reference to FIG. 15. Referring to FIGS. 15-16, the sign is set, zero and one are detected, mantissa and exponent for cases not zero or one are determined, and final mantissa for the normal case is determined.

As for gate count and power comparison, the sample metrics below may be obtained based on Gen12 Synthesis at 1.25× frequency (where "Sno" refers to Sample number).

| Sno | Metric | Main Rescale (71 bit) | Small Rescale (32 bit) | New Rescale (8 bit) |
|---|---|---|---|---|
| 1 | Area (Gatecount) | 184729 | 15896 | 2320 |
| 2 | Power (pF) | 44 | 16 | 5 |

Figure 17:
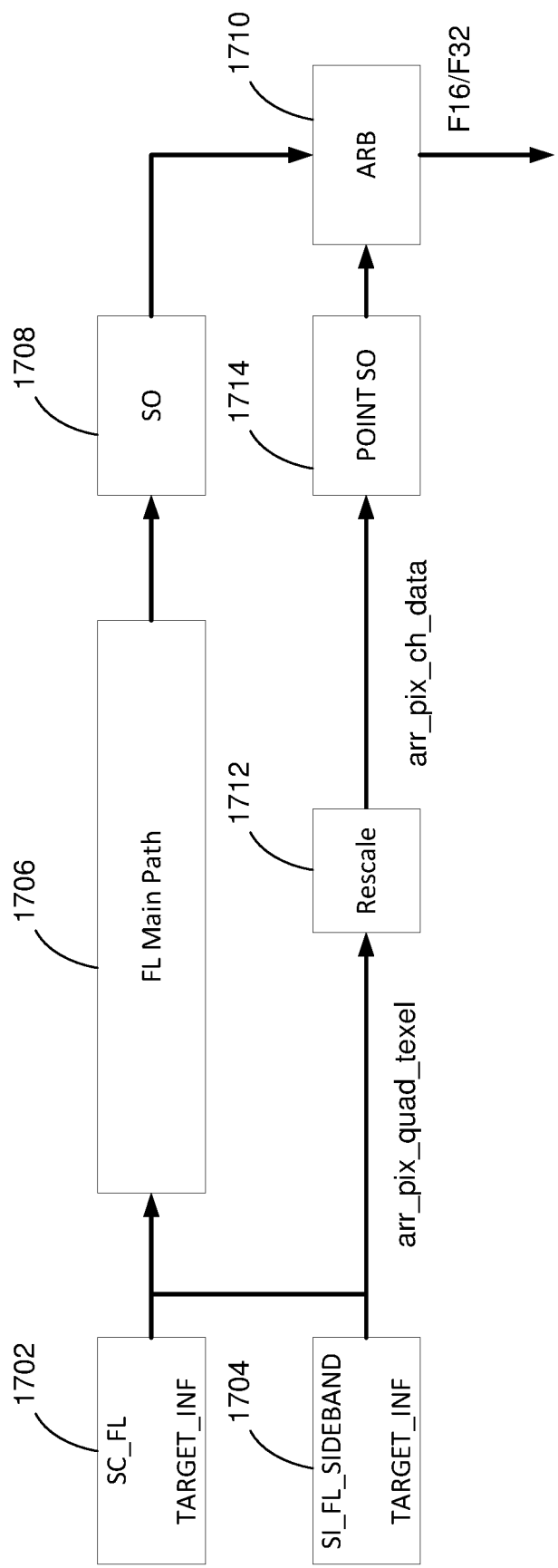
FIG. 17 illustrates a block diagram of logic to allow for point bypass, according to an embodiment.

FIG. 17 illustrates a block diagram of logic to allow for point bypass, according to an embodiment. Point sample refers to the pixel mode used for at least 40% of all benchmarks. Saving power on this case will help overall sampler power. To be able to save power in point sample, a new path may be used for point sample which consumes less power (e.g., 15-20 pF compared to 95 pF) in main path. But the point sample return to EU needs conversion into float which needs duplicated hardware for the bypass path. The bypass buffer power can be around 12 pF and format conversion power is the next big power factor to save. The low cost unorm rescale enables the point path power reduction effort the most. This aligns with the goal of delivering best performance per watt IP (Intellectual Property) block with the least gate count.

Referring to FIG. 17, the FL Main path 1706 is used as the only path for point sample to traverse. The point SO (Sampler Output) unit 1714 is the buffer for the bypass path after rescale 1712. The Sampler Output unit is responsible for sequencing sub-spans (or collection of pixels) into channels back to Shader core. Before the data is sent into point SO 1714, it is converted to float using the dedicated rescale described herein, e.g., with reference to FIGS. 15-16. An arbitration logic (ARB) 1710 then selects between the output of the main path 1706 (through buffer SO 1708) and the bypass path (through point SO 1714). As discussed herein, "SC_FL" generally refers to Sampler Cache to Filter (which is the interface where the data is transferred from the cache to the filter unit), "SI_FL_sideband" refers to the bypass from the sampler input to the filter unit (which can be used to send control information), and "arr" refers to array.

The following examples pertain to further embodiments. Example 1 includes an apparatus comprising: conversion logic to convert an unsigned normalized (unorm) integer value to a floating-point value based on detection of whether the unorm integer matches one of three cases, wherein the unorm integer value comprises n bits; and memory to store a count value corresponding to n−1 bits of the unorm integer value after detection of a leading 1 in the unorm integer value, wherein the three cases comprise: a first case with all zeros, a second case with all ones, and a third case with a combination of one or more zeros and one or more ones. Example 2 includes the apparatus of example 1, wherein for the first case and the second case, an output of the conversion logic is a constant. Example 3 includes the apparatus of example 1, wherein for the third case, leading one detection, shift, and rounding operations on the unorm integer value are limited to n bits. Example 4 includes the apparatus of example 3, wherein the shift operation is a left shift operation by up to n bits. Example 5 includes the apparatus of example 3, comprising logic to replicate data shifted by the shift operation. Example 6 includes the apparatus of example 1, wherein the conversion logic is to extract a least significant bit from a mantissa of the unorm integer value. Example 7 includes the apparatus of example 6, wherein the conversion logic is to add a one to the extracted least significant bit to round the mantissa. Example 8 includes the apparatus of example 1, wherein the memory comprises volatile or non-volatile memory. Example 9 includes the apparatus of example 1, wherein the conversion logic is coupled to or included in a processor. Example 10 includes the apparatus of example 9, wherein the processor comprises a Graphics Processing Unit (GPU) having one or more graphics processing cores. Example 11 includes the apparatus of example 9, wherein the processor comprises one or more processor cores. Example 12 includes the apparatus of example 1, wherein one or more of: a processor, the conversion logic, and the memory are on a single integrated circuit die.

Example 13 includes one or more computer-readable medium comprising one or more instructions that when executed on at least one processor configure the at least one processor to perform one or more operations to cause: conversion logic to convert an unsigned normalized (unorm) integer value to a floating-point value based on detection of whether the unorm integer matches one of three cases, wherein the unorm integer value comprises n bits; and memory to store a count value corresponding to n−1 bits of the unorm integer value after detection of a leading 1 in the unorm integer value, wherein the three cases comprise: a first case with all zeros, a second case with all ones, and a third case with a combination of one or more zeros and one or more ones.

Example 14 includes the one or more computer-readable medium of example 13, wherein for the first case and the second case, an output of the conversion logic is a constant. Example 15 includes the one or more computer-readable medium of example 13, wherein for the third case, leading one detection, shift, and rounding operations on the unorm integer value are limited to n bits. Example 16 includes the one or more computer-readable medium of example 15, wherein the shift operation is a left shift operation by up to n bits. Example 17 includes the one or more computer-readable medium of example 15, wherein the one or more computer-readable medium comprise one or more instructions that when executed on the at least one processor configure the at least one processor to perform one or more operations to cause replication of data shifted by the shift operation. Example 18 includes the one or more computer-readable medium of example 13, wherein the conversion logic is to extract a least significant bit from a mantissa of the unorm integer value. Example 19 includes the one or more computer-readable medium of example 18, wherein the one or more computer-readable medium comprise one or more instructions that when executed on the at least one processor configure the at least one processor to perform one or more operations to cause the conversion logic to add a one to the extracted least significant bit to round the mantissa. Example 20 includes the one or more computer-readable medium of example 13, wherein the memory comprises volatile or non-volatile memory. Example 21 includes a computing system comprising: a processor having one or more processor cores; memory, coupled to the processor, to store one or more bits of data; and conversion logic, coupled to or implemented in the processor, to convert an unsigned normalized (unorm) integer value to a floating-point value based on detection of whether the unorm integer matches one of three cases, wherein the unorm integer value comprises n bits; and the memory to store a count value corresponding to n−1 bits of the unorm integer value after detection of a leading 1 in the unorm integer value, wherein the three cases comprise: a first case with all zeros, a second case with all ones, and a third case with a combination of one or more zeros and one or more ones. Example 22 includes the computing system of example 11, wherein for the first case and the second case, an output of the conversion logic is a constant. Example 23 includes the computing system of example 21, wherein for the third case, leading one detection, shift, and rounding operations on the unorm integer value are limited to n bits. Example 24 includes the computing system of example 23, wherein the shift operation is a left shift operation by up to n bits. Example 25 includes the computing system of example 23, comprising logic to replicate data shifted by the shift operation.

Example 26 includes an apparatus comprising means to perform a method as set forth in any preceding example. Example 27 includes machine-readable storage including machine-readable instructions, when executed, to implement a method or realize an apparatus as set forth in any preceding example.

In various embodiments, the operations discussed herein, e.g., with reference to FIG. 1 et seq., may be implemented as hardware (e.g., logic circuitry), software, firmware, or combinations thereof, which may be provided as a computer program product, e.g., including one or more tangible (e.g., non-transitory) machine-readable or computer-readable medium having stored thereon instructions (or software procedures) used to program a computer to perform a process discussed herein. The machine-readable medium may include a storage device such as those discussed with respect to FIG. 1 et seq.

Additionally, such computer-readable media may be downloaded as a computer program product, wherein the program may be transferred from a remote computer (e.g., a server) to a requesting computer (e.g., a client) by way of data signals provided in a carrier wave or other propagation medium via a communication link (e.g., a bus, a modem, or a network connection).

Reference in the specification to "one embodiment" or "an embodiment" means that a particular feature, structure, and/or characteristic described in connection with the embodiment may be included in at least an implementation. The appearances of the phrase "in one embodiment" in various places in the specification may or may not be all referring to the same embodiment.

Also, in the description and claims, the terms "coupled" and "connected," along with their derivatives, may be used. In some embodiments, "connected" may be used to indicate that two or more elements are in direct physical or electrical contact with each other. "Coupled" may mean that two or more elements are in direct physical or electrical contact. However, "coupled" may also mean that two or more elements may not be in direct contact with each other, but may still cooperate or interact with each other.

Thus, although embodiments have been described in language specific to structural features and/or methodological acts, it is to be understood that claimed subject matter may not be limited to the specific features or acts described. Rather, the specific features and acts are disclosed as sample forms of implementing the claimed subject matter.

The invention claimed is:

1. An apparatus comprising:
   conversion logic circuitry to convert an unsigned normalized (unorm) integer value to a floating-point value based on detection of whether the unorm integer matches one of three cases, wherein the unorm integer value comprises n bits; and
   memory to store a count value corresponding to n−1 bits of the unorm integer value after detection of a leading one in the unorm integer value,
   wherein the three cases comprise: a first case with all zeros, a second case with all ones, and a third case with a combination of one or more zeros and one or more ones, wherein the first case or the second case are to cause the conversion circuitry to generate the floating-point value based on a constant exponent and a mantissa of the unorm integer value, wherein the third case is to cause the conversion circuitry to generate the floating-point value based on an offset-count and a concatenated mantissa, wherein the offset-count is to be determined based on a difference between the count value and an offset value.

2. The apparatus of claim 1, wherein for the first case and the second case, an output of the conversion logic is a constant.

3. The apparatus of claim 1, wherein for the third case, leading one detection, shift, and rounding operations on the unorm integer value are limited to n bits.

4. The apparatus of claim 3, wherein the shift operation is a left shift operation by up to n bits.

5. The apparatus of claim 3, comprising logic to replicate data shifted by the shift operation.

6. The apparatus of claim 1, wherein the conversion logic is to extract a least significant bit from the mantissa of the unorm integer value.

7. The apparatus of claim 6, wherein the conversion logic is to add a one to the extracted least significant bit to round the mantissa.

8. The apparatus of claim 1, wherein the memory comprises volatile or non-volatile memory.

9. The apparatus of claim 1, wherein the conversion logic is coupled to or included in a processor.

10. The apparatus of claim 9, wherein the processor comprises a Graphics Processing Unit (GPU) having one or more graphics processing cores.

11. The apparatus of claim 9, wherein the processor comprises one or more processor cores.

12. The apparatus of claim 1, wherein one or more of: a processor, the conversion logic, and the memory are on a single integrated circuit die.

13. The apparatus of claim 1, wherein a bypass path of a floating point unit comprises the conversion logic circuitry to transmit the floating-point value to a point sampler output unit.

14. One or more non-transitory computer-readable medium comprising one or more instructions that when executed on at least one processor configure the at least one processor to perform one or more operations to cause:
conversion logic circuitry to convert an unsigned normalized (unorm) integer value to a floating-point value based on detection of whether the unorm integer matches one three cases, wherein the unorm integer value comprises n bits; and
memory to store a count value corresponding to n−1 bits of the unorm integer value after detection of a leading one in the unorm integer value,
wherein the three cases comprise: a first case with all zeros, a second case with all ones, and a third case with a combination of one or more zeros and one or more ones, wherein the first case or the second case are to cause the conversion circuitry to generate the floating-point value based on a constant exponent and a mantissa of the unorm integer value, wherein the third case is to cause the conversion circuitry to generate the floating-point value based on an offset-count and a concatenated mantissa, wherein the offset-count is to be determined based on a difference between the count value and an offset value.

15. The non-transitory one or more computer-readable medium of claim 14, wherein for the first case and the second case, an output of the conversion logic is a constant.

16. The non-transitory one or more computer-readable medium of claim 14, wherein for the third case, leading one detection, shift, and rounding operations on the unorm integer value are limited to n bits.

17. The non-transitory one or more computer-readable medium of claim 16, wherein the shift operation is a left shift operation by up to n bits.

18. The non-transitory one or more computer-readable medium of claim 16, wherein the one or more computer-readable medium comprise one or more instructions that when executed on the at least one processor configure the at least one processor to perform one or more operations to cause replication of data shifted by the shift operation.

19. The non-transitory one or more computer-readable medium of claim 14, wherein the conversion logic is to extract a least significant bit from the mantissa of the unorm integer value.

20. The non-transitory one or more computer-readable medium of claim 19, wherein the one or more computer-readable medium comprise one or more instructions that when executed on the at least one processor configure the at least one processor to perform one or more operations to cause the conversion logic to add a one to the extracted least significant bit to round the mantissa.

21. The non-transitory one or more computer-readable medium of claim 14, wherein the memory comprises volatile or non-volatile memory.

22. The non-transitory one or more computer-readable medium of claim 14, wherein a bypass path of a floating point unit comprises the conversion logic circuitry to transmit the floating-point value to a point sampler output unit.

23. A computing system comprising:
a processor having one or more processor cores;
memory, coupled to the processor, to store one or more bits of data; and
conversion logic circuitry, coupled to or implemented in the processor, to convert an unsigned normalized (unorm) integer value to a floating-point value based on detection of whether the unorm integer matches one three cases, wherein the unorm integer value comprises n bits; and
the memory to store a count value corresponding to n−1 bits of the unorm integer value after detection of a leading one in the unorm integer value,
wherein the three cases comprise: a first case with all zeros, a second case with all ones, and a third case with a combination of one or more zeros and one or more ones, wherein the first case or the second case are to cause the conversion circuitry to generate the floating-point value based on a constant exponent and a mantissa of the unorm integer value, wherein the third case is to cause the conversion circuitry to generate the floating-point value based on an offset-count and a concatenated mantissa, wherein the offset-count is to be determined based on a difference between the count value and an offset value.

24. The computing system of claim 23, wherein for the first case and the second case, an output of the conversion logic is a constant.

25. The computing system of claim 23, wherein for the third case, leading one detection, shift, and rounding operations on the unorm integer value are limited to n bits.

26. The computing system of claim 25, wherein the shift operation is a left shift operation by up to n bits.

27. The computing system of claim 25, comprising logic to replicate data shifted by the shift operation.

* * * * *